US009276585B2

(12) United States Patent
Nakamura et al.

(10) Patent No.: US 9,276,585 B2
(45) Date of Patent: Mar. 1, 2016

(54) FREQUENCY-LOCKED LOOP CIRCUIT AND SEMICONDUCTOR INTEGRATED CIRCUIT

(71) Applicant: Renesas Electronics Corporation, Kawasaki-shi (JP)

(72) Inventors: Takashi Nakamura, Kawasaki (JP); Kosuke Yayama, Kawasaki (JP); Masaaki Iijima, Kawasaki (JP)

(73) Assignee: Renesas Electronics Corporation, Kawasaki-shi, Kanagawa (JP)

( * ) Notice: Subject to any disclaimer, the term of this patent is extended or adjusted under 35 U.S.C. 154(b) by 0 days.

(21) Appl. No.: 14/244,800

(22) Filed: Apr. 3, 2014

(65) Prior Publication Data

US 2014/0312981 A1 Oct. 23, 2014

(30) Foreign Application Priority Data

Apr. 18, 2013 (JP) ................................. 2013-087802

(51) Int. Cl.
*H03L 7/099* (2006.01)
*H03L 1/02* (2006.01)
*H03L 7/02* (2006.01)
*H03L 7/06* (2006.01)
(Continued)

(52) U.S. Cl.
CPC *H03L 1/022* (2013.01); *H03L 7/00* (2013.01); *H03L 7/02* (2013.01); *H03L 7/06* (2013.01);
(Continued)

(58) Field of Classification Search
CPC ........... H04B 1/71635; H04B 1/71637; H04B 2001/71365; H04B 7/18532; H04B 1/001; H04B 1/0082; H04B 1/30; H04B 1/403; H04B 1/405; H04B 1/0475; H04B 2001/045; H04L 27/361; H04L 41/142; H04L 43/0858; H04L 43/0864; H04L 43/106; H04L 47/28; H04L 7/0008; H04L 7/033; H04L 27/20; H04L 7/0083; H04L 7/0331; H03L 7/02; H03L 7/06; H03L 7/099

USPC ............. 331/1 R, 34, 177 R, 57, 18; 327/156
See application file for complete search history.

(56) References Cited

U.S. PATENT DOCUMENTS

| 6,943,632 | B2 | 9/2005 | Sanduleanu |
| 7,786,776 | B2 | 8/2010 | Yamakido et al. |
| 8,390,349 | B1 * | 3/2013 | Ravi et al. ..................... 327/156 |

FOREIGN PATENT DOCUMENTS

| JP | 2004-520779 A | 7/2004 |
| JP | 2009-188699 A | 8/2009 |

OTHER PUBLICATIONS

Sung Tae Moon, et al, "Fully Integrated Frequency Synthesizers: A Tutorial", International Journal of High Speed Electronics and Systems @ World Scientific Publishing Company, vol. 15, Issue 02, pp. 1-23, Jun. 2005.

*Primary Examiner* — Arnold Kinkead
(74) *Attorney, Agent, or Firm* — McGinn IP Law Group, PLLC

(57) ABSTRACT

A frequency-locked loop circuit has a digital control oscillator that generates a clock, and an FLL controller that generates a frequency control code to control an oscillation frequency of the clock. The FLL controller has a frequency comparison unit and a delay code control unit. The frequency comparison unit compares a frequency of a clock generated by the digital control oscillator with a frequency of a multiplied reference clock. The delay code control unit generates, based on a comparison result of the frequency comparison unit, the frequency control code so that the frequency of the clock generated by the digital control oscillator matches the frequency of the multiplied reference clock. The frequency comparison unit determines the frequency of the clock by using first and second thresholds. The delay code control unit generates the frequency control code according to a determination of the frequency comparison unit.

20 Claims, 19 Drawing Sheets

(51) Int. Cl.
*H03L 7/00* (2006.01)
*H03L 7/16* (2006.01)
*H03L 7/22* (2006.01)

(52) U.S. Cl.
CPC  *H03L 7/099* (2013.01); *H03L 7/16* (2013.01); *H03L 7/22* (2013.01); *H03L 2207/06* (2013.01); *H03L 2207/50* (2013.01)

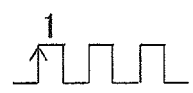 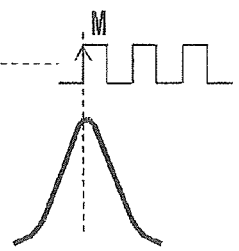 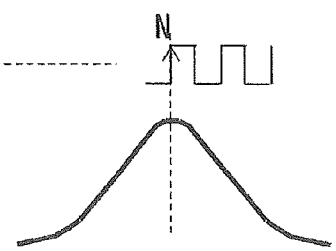
Fig. 16A　　　　　Fig. 16B　　　　　Fig. 16C
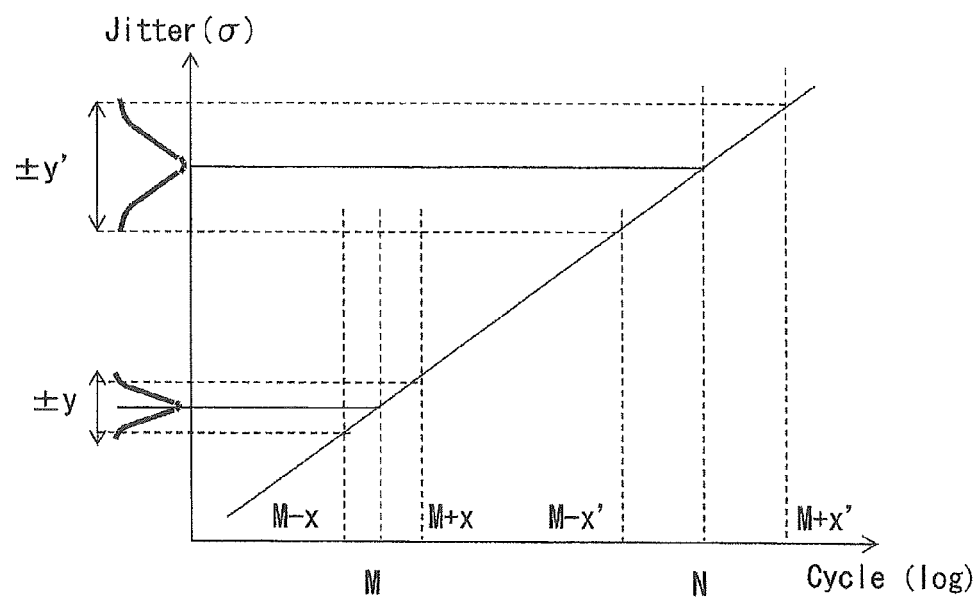
Fig. 16D

US 9,276,585 B2

FREQUENCY-LOCKED LOOP CIRCUIT AND SEMICONDUCTOR INTEGRATED CIRCUIT

CROSS-REFERENCE TO RELATED APPLICATIONS

This application is based upon and claims the benefit of priority from Japanese patent application No. 2013-087802, filed on Apr. 18, 2013, the disclosure of which is incorporated herein in its entirety by reference.

BACKGROUND

The present invention relates to a frequency-locked loop circuit and a semiconductor integrated circuit incorporating the frequency-locked loop circuit.

Heretofore, low-power-consumption microcomputers (a microcomputer, a microcontroller, a microprocessor, and the like are hereinafter collectively called "a microcomputer") incorporate a real time clock (RTC) function in many cases. In addition, it is necessary to improve the battery life of mobile devices, such as a smartphone and a digital still camera (DSC), which operate on a battery. Furthermore, white goods, such as a refrigerator and a washing machine, are required to be environmentally and economically friendly (eco-friendly) and to have an improved energy-saving performance. Under such circumstances, a microcomputer having a low voltage, low power consumption, and high performance tends to incorporate therein a clock dedicated chip RTC, which is an external component, and needs to be provided with an external crystal oscillator having a frequency of 32.768 KHz.

In an LSI (Large Scale Integration) of a microcomputer, a high-frequency clock is generated from a low-frequency clock of 32.768 KHz. A PLL (Phase Locked Loop: phase-locked loop circuit) is known as a typical technique for supplying the high-frequency clock to the inside of the LSI.

The PLL is a clock generator that multiplies an externally-supplied reference clock and supplies a high-frequency clock to the inside of the LSI. The PLL is conventionally designed with an LPF characteristic to be equal to ⅒ (min ¼) of that of the reference clock so as to realize a stable operation against noise and fluctuation of the reference clock (see Sung Tae Moon, Ari Yakov Valero-L'opez, and Edgar S'anchez-Sinencio "FULLY INTEGRATED FREQUENCY SYNTHESIZERS: A TUTORIAL", International Journal of High Speed Electronics and Systems @ World Scientific Publishing Company). Accordingly, in many cases, the PLL is not used in the LSI that is supplied with only a low-frequency reference clock.

This is because when the PLL is used in the LSI that is supplied with only a low-frequency reference clock, the LPF characteristic thereof has a cut-off frequency of several KHz, and when the PLL is realized using monolithic capacitive elements and resistive elements, a large area is required, which is impractical in terms of cost. For example, when the input frequency is 32.768 KHz, a capacitance value of about 1 [nF] is required at about 3.2 KHz.

Thus, in place of the PLL, an FLL (Frequency Locked Loop) is widely applied as a clock generator capable of generating, as with the PLL, a high-frequency clock in an LSI with a small area.

While the FLL has an advantage of being capable of generating a high-frequency clock from a low-frequency clock with a small area, the FLL has a technical problem that a time for acquiring a frequency lock (a lock time or a set ring time) (hereinafter referred to as "lock time") is long because a low-frequency clock is used as a reference.

For example, the Published Japanese Translation of PCT International Publication for Patent Application, No. 2004-520779 discloses a frequency locked-loop circuit that restores a clock from a signal transmitted through an optical fiber. This frequency locked-loop circuit includes a loop for locking a frequency and a loop for locking a phase, and has an object to simplify a dual-loop clock recovery circuit.

The FLL circuit disclosed in Japanese Unexamined Patent Application Publication No. 2009-188699 achieves a reduction in lock time, which is a conventional problem to be solved. FIG. 19 is a block diagram showing a digital control oscillator of related art. As shown in FIG. 19, a digital control oscillator 510 includes a 2-input NAND gate 511 with one input terminal supplied with a reset signal Reset, and a digital control variable delay circuit 512 including N−1 delay cells each having a unit delay amount td. The number of delay stages N−1 of the digital control variable delay circuit 512 is set at a given value in the range from a minimum value "0" to a maximum value "31" according to the control by the digital control unit 520. Since the 2-input NAND gate 511 also has the unit delay amount td, a total delay time N·td of the 2-input NAND gate 511 and the digital control variable delay circuit 512 of the circuit type of a delay ring oscillation unit can be set within the range from a minimum delay time 1·td to a maximum delay time 32·td. This digital control oscillator can control frequencies by switching the number of delay stages.

In the FLL circuit disclosed in Japanese Unexamined Patent Application Publication No. 2009-188699, a memory circuit is provided to the inside of an IP, or to an LSI that incorporates the IP, and a plurality of bits of design information or evaluation result information on the oscillation frequency of the digital control oscillator of the FLL circuit are stored into the memory circuit, thereby making it possible to significantly reduce the lock time.

SUMMARY

However, in the digital control oscillator and the digital control FLL circuit using the digital control oscillator, the jitter performance of the output clock is determined by the frequency resolution of the digital control oscillator, whereas in a typical digital control oscillator incorporating delay cells, the resolution is determined by a delay of the CMOS circuit, so the performance thereof is limited. There is another problem that deterministic jitter occurs in the output clock due to the control repeatedly performed for each reference clock, which deteriorates the frequency precision.

Other problems to be solved and novel features of the present invention will be apparent from the following description and the accompanying drawings.

An exemplary aspect of the present invention is a frequency-locked loop circuit including: a digital control oscillator that generates a clock; and an FLL controller that generates a frequency control code to control an oscillation frequency of the clock. The FLL controller includes: a frequency comparison unit that compares a frequency of a clock generated by the digital control oscillator with a frequency of a multiplied reference clock; and a delay code control unit that generates, based on a comparison result of the frequency comparison unit, the frequency control code so that the frequency of the clock generated by the digital control oscillator matches the frequency of the multiplied reference clock. The frequency comparison unit determines the frequency of the clock by using first and second thresholds. The delay code control unit generates the frequency control code according to a determination result of the frequency comparator, and outputs the frequency control code to the digital control oscillator.

According to an exemplary aspect of the present invention, it is possible to provide a frequency-locked loop circuit with enhanced frequency precision, and a semiconductor integrated circuit incorporating the frequency-locked loop circuit.

BRIEF DESCRIPTION OF THE DRAWINGS

The above and other aspects, advantages and features will be more apparent from the following description of certain embodiments taken in conjunction with the accompanying drawings, in which:

FIG. 16A is a diagram for explaining an effect of long-term jitter on the FLL circuit;

FIG. 16B is a diagram for explaining an effect of long-term jitter on the FLL circuit;

FIG. 16C is a diagram for explaining an effect of long-term jitter on the FLL circuit;

FIG. 16D is a graph for explaining an effect of long-term jitter on the FLL circuit;

DETAILED DESCRIPTION

Specific embodiments will be described in detail below with reference to the drawings. A semiconductor device according to an embodiment can be applied to, for example, a microcomputer which has a low voltage, low power consumption, and high performance and includes a memory circuit such as a flash memory. The semiconductor device can improve a battery life in mobile devices, such as a smartphone and a DSC (digital still camera), which operate on a battery. The semiconductor device also satisfies the demand for improving the eco-friendly power-saving performance of white goods such as a refrigerator and a washing machine.

Figure 1:
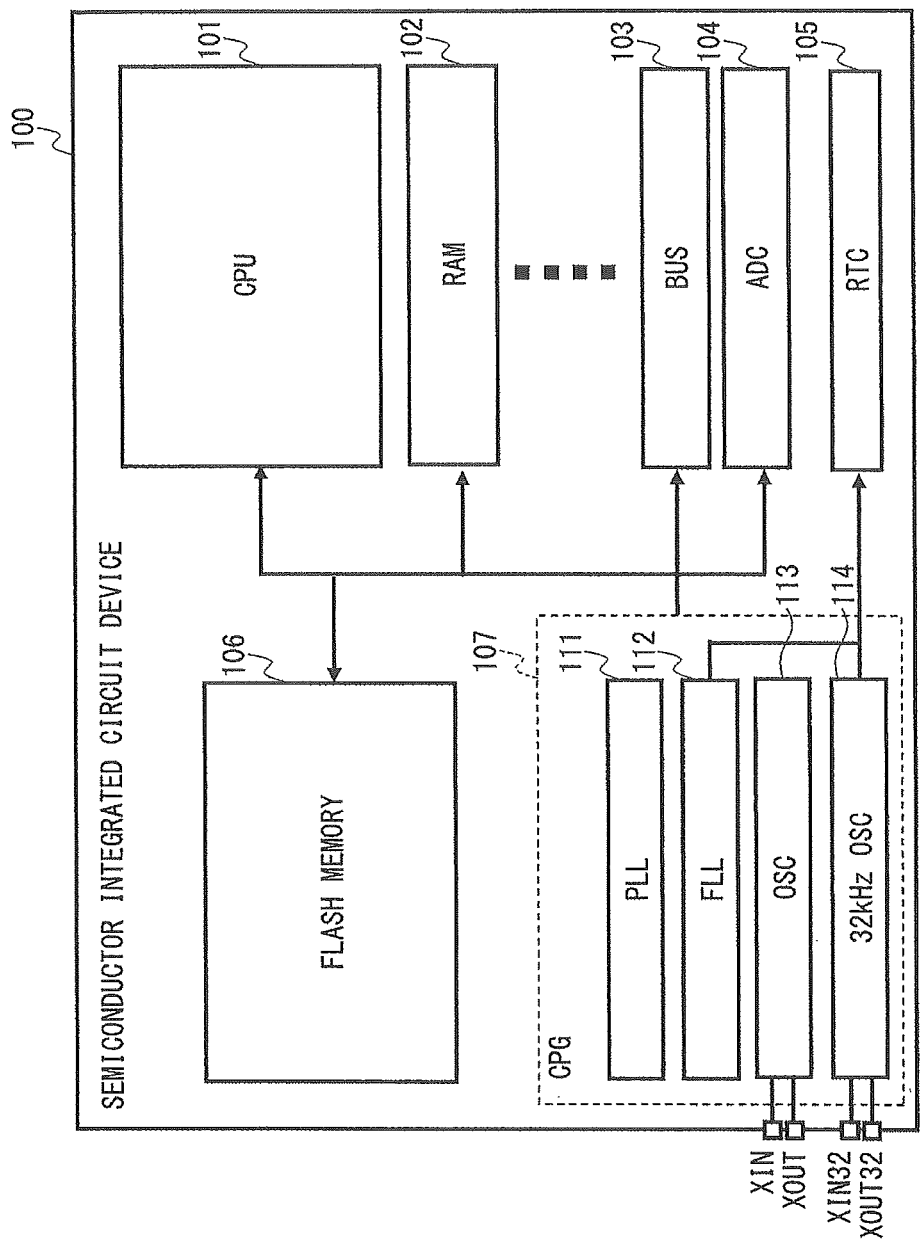
FIG. 1 is a block diagram showing a semiconductor integrated circuit device according to an embodiment.

FIG. 1 is a block diagram showing a semiconductor integrated circuit device according to an embodiment. As shown in FIG. 1, the semiconductor integrated circuit device includes, for example, a CPU (central processing unit) 101, a RAM (random access memory) 102, a BUS 103, an ADC (analog-to-digital converter) circuit 104, a RTC circuit 105, a flash memory 106, and a CPG (clock pulse generator) circuit 107. The CPG circuit 107 includes a PLL circuit 111, an FLL circuit 112, an OSC circuit 113, and a 32 KHz OSC circuit 114.

In this case, the flash memory 106 holds an initial code that is used for an initial operation by the FLL circuit 112. The FLL circuit 112 uses, instead of a digital control signal DCO_CODE to be described later, the initial code held in the flash memory 106, during a period between a time immediately after resetting and a time when a normal operation period is started, and adjusts the frequency of a generated clock so as to match the frequency of a multiplied reference clock. After the start of the normal operation period, a frequency control code is generated by a method to be described later, to thereby control the clock frequency. A digital control oscillator (see FIG. 3) of the FLL circuit 112 determines the frequency of the generated clock and the frequency of the multiplied reference clock by using first and second thresholds, and generates the digital control signal DCO_CODE according to the determination result. Thus, the use of binary thresholds (frequency determination counter thresholds TH_LOW and TH_HIGH) reduces unnecessary changes of the digital control signal DCO_CODE, thereby reducing deterministic jitter, resulting in a reduction in total period jitter.

Figure 2:
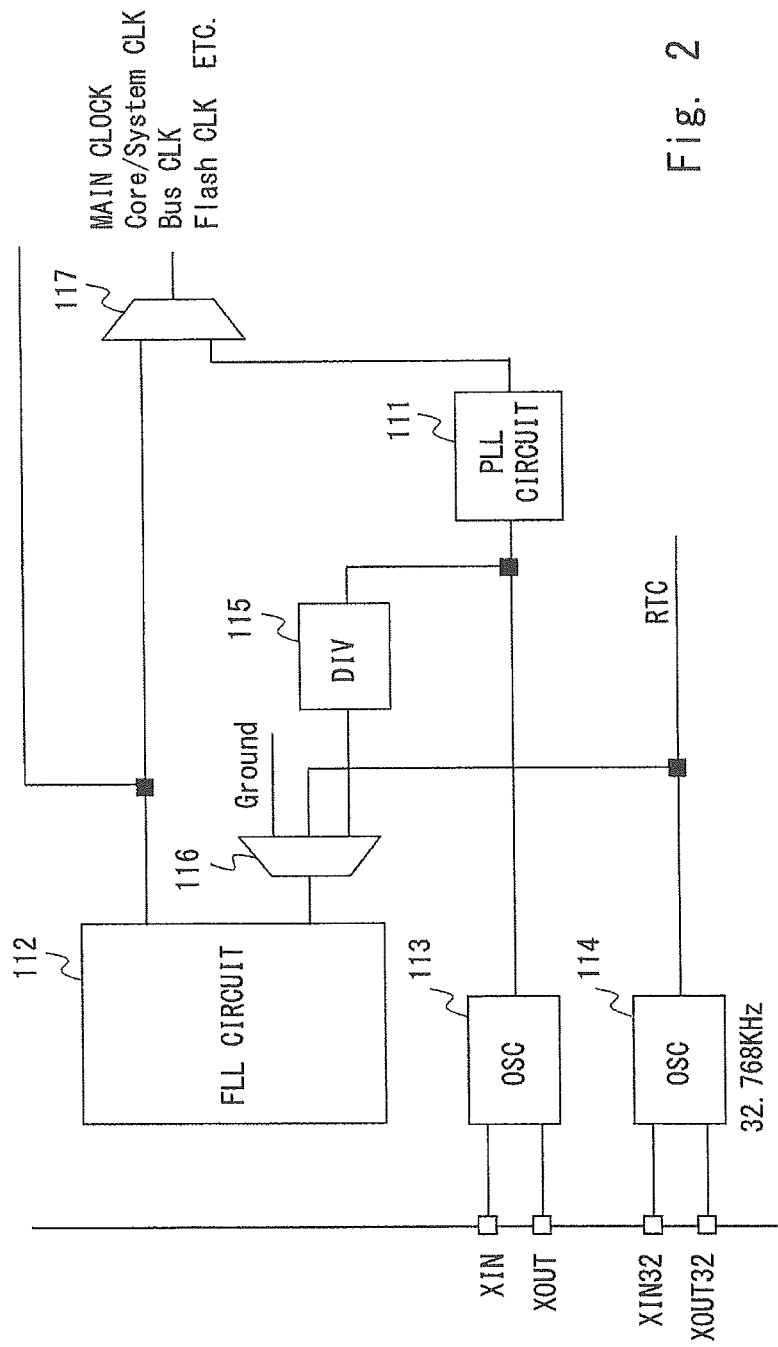
FIG. 2 is a block diagram showing a CPG circuit.

FIG. 2 is a block diagram showing the CPG circuit 107. As shown in FIG. 2, the CPG circuit 107 may include, for example, the PLL circuit 111, the FLL circuit 112, the OSC circuit 113, the 32 KHz OSC circuit 114, a DIV (divider) 115, and selectors 116 and 117, and generates a plurality of clocks with different frequencies necessary for allowing the microcomputer to operate. A combination of the 32 KHz OSC circuit 114 having a frequency from several MHz to several tens of MHz, the OSC circuit 113, and the PLL circuit 111 can generate main clocks, such as a system clock and a bus clock having a frequency of several tens of MHz, which are necessary for the operation of the microcomputer. A combination of the OSC circuit 114 having a frequency of 32.768 KHz and the OSC circuit 113 can generate a clock having a frequency of 32.768 KHz for RTC.

The FLL circuit 112 receives, as the reference clock, the output clock of the 32 kHz OSC circuit 114 via the selector 116, and can generate a clock having a frequency of several tens of MHz necessary for the operation of the microcomputer. In other words, the 32 KHz OSC 114 functions as a reference clock supply unit that supplies the reference clock to the FLL circuit 112. The CPG circuit 107 selects and outputs the clocks from the PLL circuit 111 or the FLL circuit 112 via the selector 117, and these clocks are used as the system clock or the like. Since the clocks generated in the FLL circuit 112 according to this embodiment have highly precise frequency characteristics, the clocks can be used as main clocks, such as the system clock and the bus clock, instead of the output of the PLL circuit 111, in the operation mode in which the OSC circuit 113 and the PLL circuit 111 are not used. The FLL circuit 112 can also receive and use, instead of the output clock having a frequency of 32.768 KHz of the 32 kHz OSC circuit 114, the reference clock which is obtained by dividing the frequency of the clock of the OSC circuit 113 by the DIV circuit 115, via the selector 116. In this case, the OSC circuit 113, the DIV circuit 115, and the selector 116 function as the reference clock supply unit that supplies the reference clock to the FLL circuit 112.

In the semiconductor integrated circuit device according to this embodiment, in the CPG circuit 107, only the FLL circuit 112 can be used without using the PLL circuit 111, and when the FLL circuit 112 is used, clocks can be generated by using only the FLL circuit 112 without using the clocks from the reference clock supply unit, such as the 32 KHz OSC 114. In the case where none of the circuits is used, the semiconductor integrated circuit device is brought into a standby state, thereby minimizing the power consumption.

Figure 17:
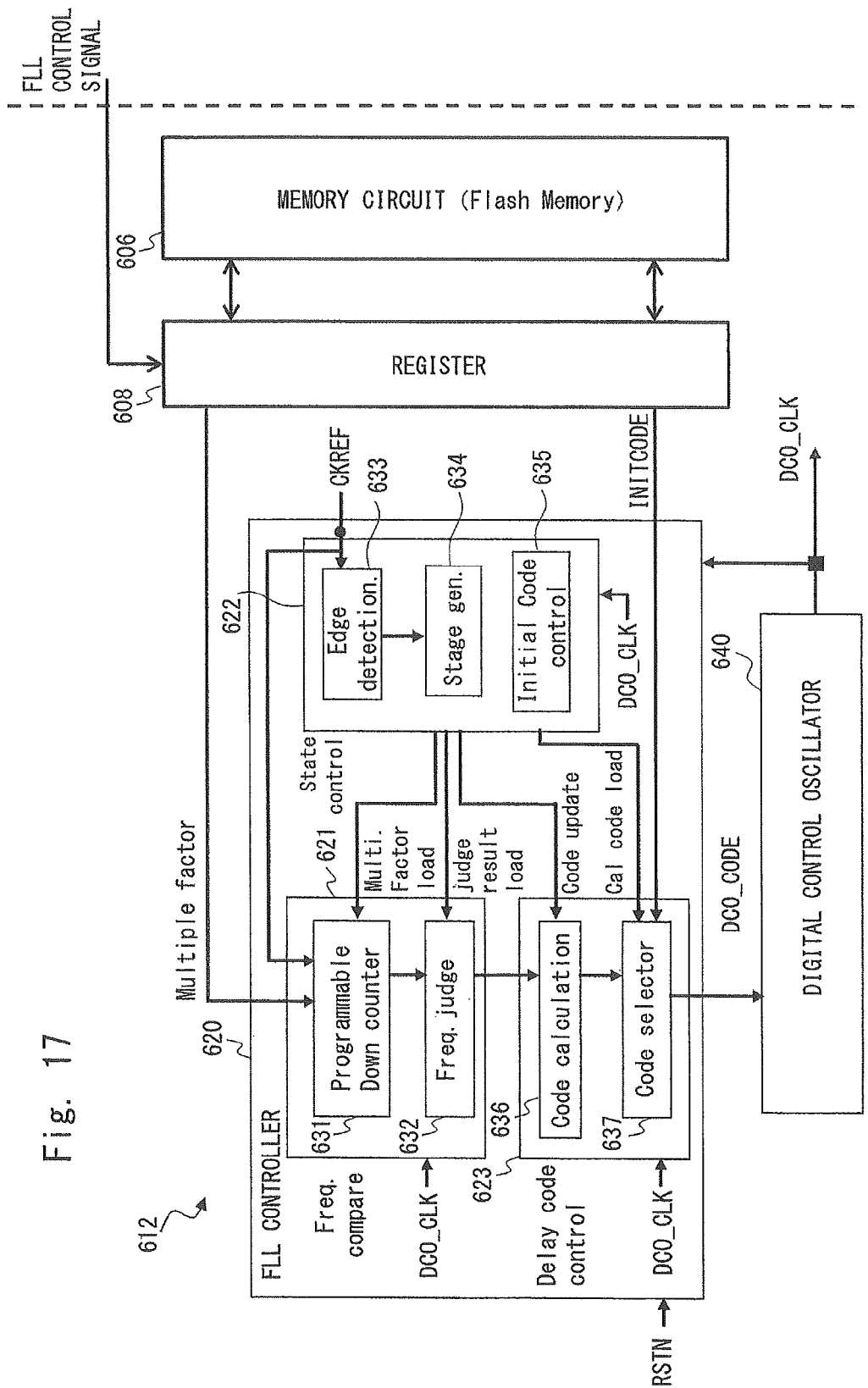
FIG. 17 is a block diagram showing an FLL circuit according to a reference example.

Next, the outline of the FLL circuit 112 according to an embodiment will be described. Prior to the description of the FLL circuit of this embodiment, an FLL circuit according to a reference example will first be described. FIG. 17 is a block diagram showing the FLL circuit according to the reference example. An FLL circuit 612 includes an FLL controller 620 and a digital control oscillator 640. A multiple factor is input to the FLL circuit 612 from an external device or the like.

The oscillation frequency of the digital control oscillator 640 is controlled by the digital control signal DCO_CODE from an external controller. The number of bits is determined by the frequency range to be secured by the FLL circuit 112. If the frequency range to be secured is wide, the number of bits of the digital control signal DCO_CODE can be increased, and when the frequency range to be secured is narrow, the number of bits can be reduced. A control register of the digital control oscillator 640 is used as means for determination with a successive approximation (Successive Approximation Register: SAR), thereby making it possible to shorten a lock time. The controller receives a reference clock (CKREF), a DCO clock (DCO_CLK), a reset signal (RSTN), a multiple factor signal (Multiple Factor), a DCO initial code (INITCODE), and outputs a digital control signal DCO_CODE.

The FLL controller 620 includes a state controller 622, a frequency comparison unit 621, and a delay code controller 623. The state controller 622 controls the state based on the reference clock CKREF. The frequency comparison unit 621 compares the frequency of the DCO clock DCO_CLK with the frequency of the reference clock CKREF. The delay code controller 623 adjusts, generates, or selects the digital control signal DCO_CODE according to the comparison result so that the frequency of the DCO clock DCO_CLK matches (the frequency of the reference clock CKREF)×(Multiple Factor). Thus, the output frequency of the DCO clock DCO_CLK is controlled. The internal components of an FLL controller 120 operate in synchronization with the DCO clock DCO_CLK.

Figure 3:
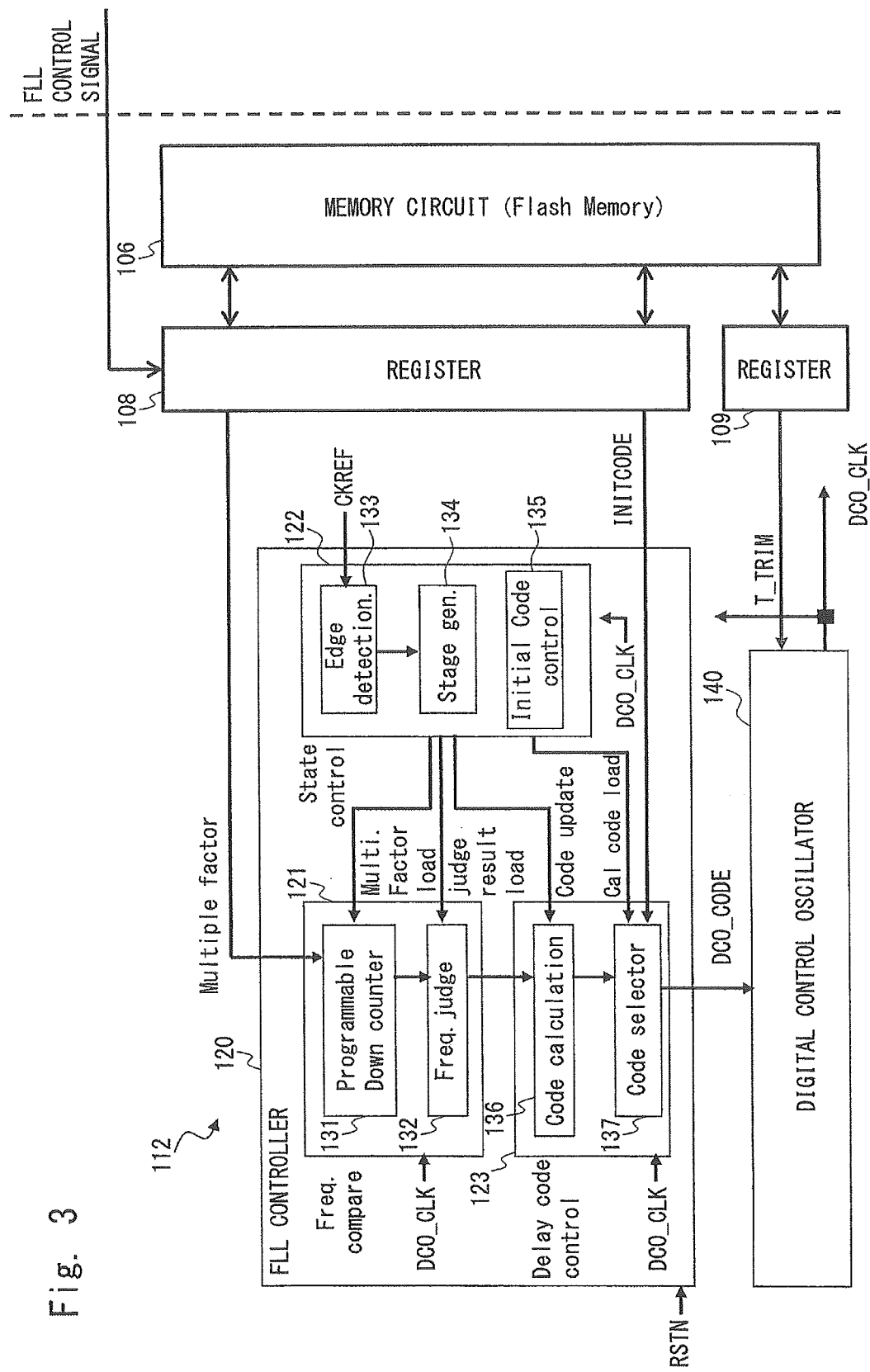
FIG. 3 is a block diagram showing an FLL circuit according to an embodiment.

Next, the FLL circuit according to this embodiment will be described. FIG. 3 is a block diagram showing the FLL circuit according to this embodiment. The FLL circuit according to this embodiment is similar to the FLL circuit 612 shown in FIG. 17 in that, for example, the FLL circuit 112 includes a frequency comparison unit 121, a state controller 122, and a delay code controller (delay code control unit) 123; the frequency comparison unit 621 compares the frequency of the DCO clock DCO_CLK with the frequency of the reference clock CKREF; and the delay code controller 123 adjusts, generates, or selects the digital control signal DCO_CODE according to the comparison result so that the frequency of the DCO clock DCO_CLK matches (the frequency of the reference clock CKREF)×(Multiple Factor), thereby controlling the output frequency of the DCO clock DCO_CLK.

The FLL controller 120 of the FLL circuit according to this embodiment has a feature that in the case of comparing the frequency of the clock generated by the digital control oscillator with the frequency of the multiplied reference clock, two thresholds (first and second thresholds) are used to thereby suppress unnecessary adjustments of the clock frequency. Accordingly, in the FLL circuit 112 according to this embodiment, deterministic jitter is reduced, with the result that the total period jitter is reduced. This makes it possible to stably output clocks with high precision even in the state where no reference is provided. Prior to the detailed description of the FLL controller 120, a digital control oscillator 140 will first be described.

Figure 4:
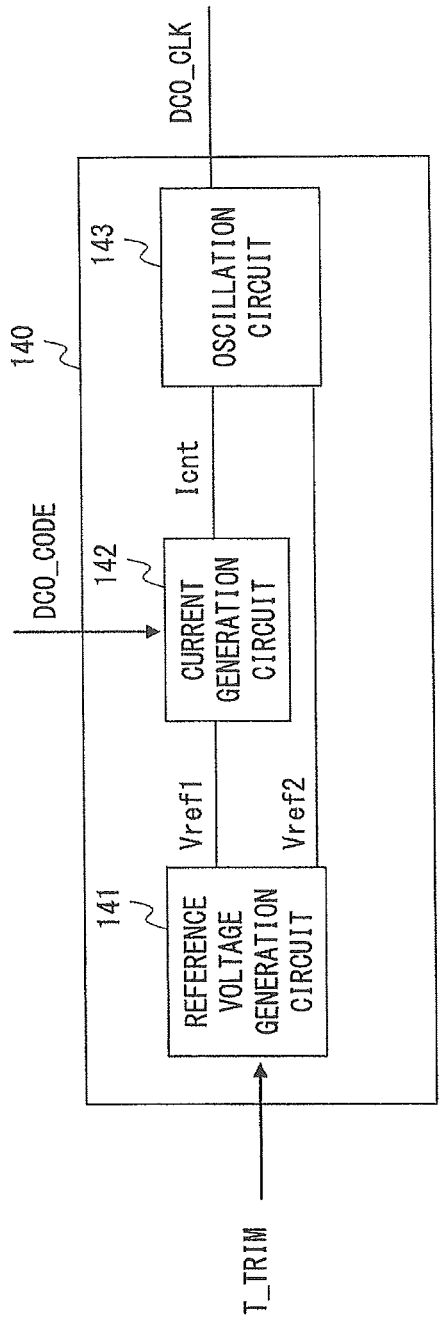
FIG. 4 is a block diagram showing a digital control oscillator of the FLL circuit according to an embodiment.

FIG. 4 is a block diagram showing the digital control oscillator 140 according to this embodiment. As shown in FIG. 4, the digital control oscillator 140 according to this embodiment includes a reference voltage generation circuit 141, a current generation circuit 142, and an oscillation circuit 143. In order to achieve an extremely short lock time, an oscillation circuit having no temperature dependence and having a frequency characteristic that does not vary with temperature is used as the digital control oscillator 140. Thus, the digital control oscillator 140 has a circuit configuration capable of temperature trimming, and is externally supplied with a temperature trimming signal T_TRIM. This temperature trimming signal indicates optimum setting information subjected to temperature trimming for each chip, and is preferably configured in such a manner that the information cannot be changed by a user. This temperature trimming information is loaded from the flash memory 106 or the like into a register 109, and is input to the digital control oscillator 140. A trimming method will be described later.

The temperature trimming signal T_TRIM is input to the reference voltage generation circuit 141, and the digital control signal DCO_CODE is input to the current generation circuit 142. The reference voltage generation circuit 141 generates a first reference voltage Vref1 and a second reference voltage Vref2 based on the temperature trimming signal T_TRIM, and outputs the first reference voltage Vref1 to the current generation circuit 142 and outputs the second reference voltage Vref2 to the oscillation circuit 143. The current generation circuit 142 generates a control current Icnt from the first reference voltage Vref1. The oscillation circuit 143 receives the control current Icnt and the second reference voltage Vref2, and generates the DCO clock DCO_CLK. The details thereof will be described below.

Figure 5:
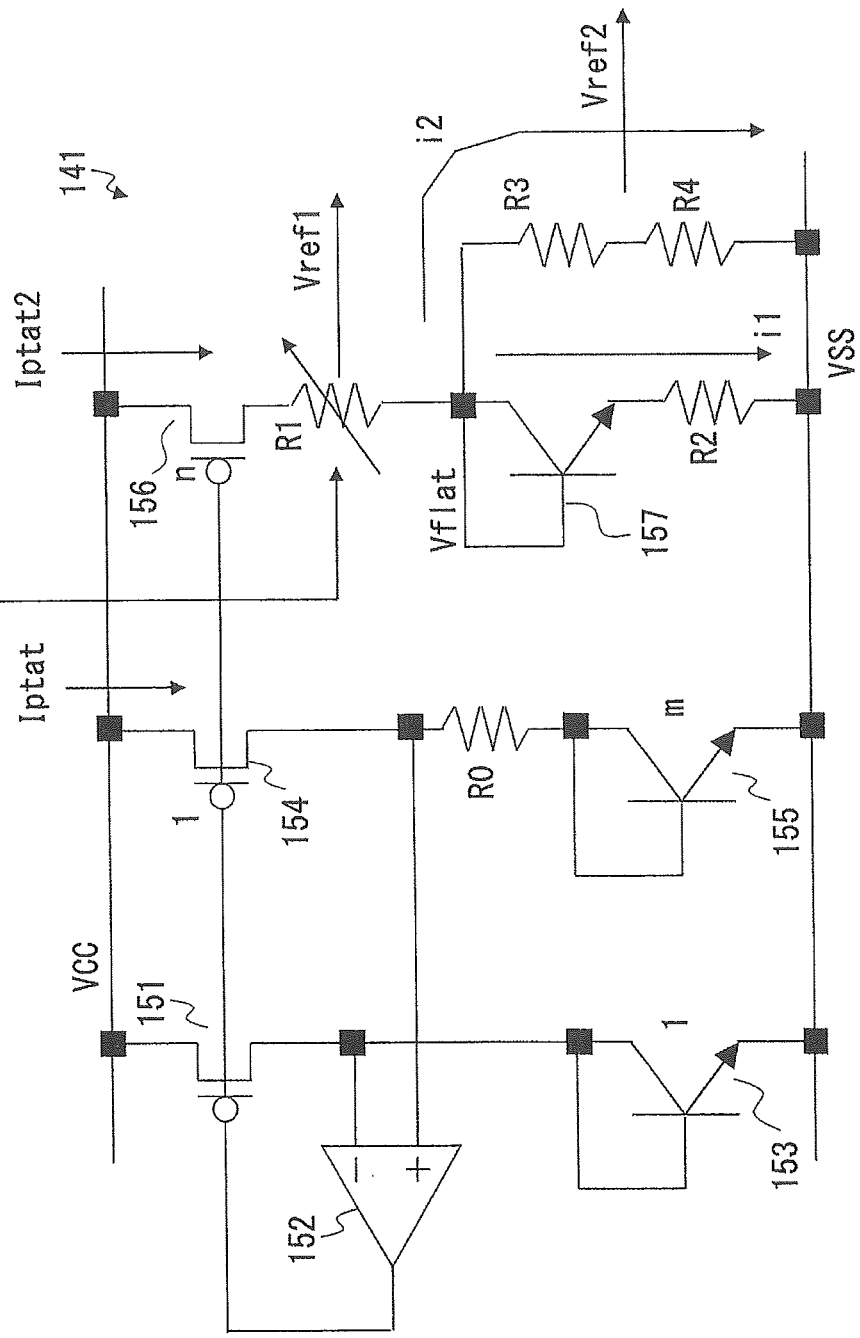
FIG. 5 is a circuit diagram showing a reference voltage generation circuit in a digital control oscillator of the FLL circuit according to an embodiment.

FIG. 5 is a circuit diagram showing the reference voltage generation circuit 141. As shown in FIG. 5, in the reference voltage generation circuit 141, a MOS transistor 151, which is connected to a VCC, a differential amplifier 152, and a bipolar transistor 153, which is connected to a VSS, are connected in series. Similarly, a MOS transistor 154, which is connected to the VCC, a resistor R0, and a bipolar transistor 155, which is connected to the VSS, are connected in series. Likewise, a MOS transistor 156, which is connected to the VCC, and a variable resistor R1 are connected in series, and a bipolar transistor 157, which is connected in series with the resistor R1, and a resistor R2, which is connected to the VSS, are connected in parallel with resistors R3 and R4. These components are connected in parallel between the VCC and the VSS. A base circuit is a BGR (Band Gap Reference) circuit including the MOS transistor 156, the resistor R1, the bipolar transistor 157, and the resistor R2, and generates the reference voltages Vref1 and Vref2 from an Iptat2 current.

The Iptat2 current has a value as follows.

$$Iptat1 = \frac{Vbe1 - Vbe2}{R_0} \quad (1)$$

$$Iptat1 = \frac{1}{R_0} \cdot \frac{kT}{q} \ln(m)$$

$$Iptat2 = n \cdot \frac{1}{R_0} \cdot \frac{kT}{q} \ln(m)$$

where

Vbe1: a base-emitter voltage of the bipolar transistor 153
Vbe2: a base-emitter voltage of the bipolar transistor 155
k: Boltzmann constant As shown below, the Iptat 2 current generates a voltage Vflat which has no temperature dependence and which is flat with respect to temperature.

$$Iptat2 = I_1 + I_2 \quad (2)$$

$$V_{flat} = (R_3 + R_4) \cdot I_2$$

$$V_{flat} = Vbe + R_2 \cdot I_1$$

$$I_1 = Iptat2 - I_2$$

$$V_{flat} = Vbe + R_2 \cdot (Iptat2 - I_2)$$

$$Vbe + R_2 \cdot (Iptat2 - I_2) = (R_3 + R_4) \cdot I_2$$

$$I_2 = \frac{Vbe + R_2 \cdot Iptat2}{R_2 + R_3 + R_4}$$

$$V_{flat} = \left(\frac{R_3 + R_4}{R_2 + R_3 + R_4}\right) \cdot (Vbe + R_2 \cdot Iptat2)$$

$$V_{flat} = \left(\frac{R_3 + R_4}{R_2 + R_3 + R_4}\right) \cdot \left(Vbe + R_2 \cdot n \cdot \frac{1}{R_0} \cdot \frac{kT}{q} \ln(m)\right)$$

The second reference voltage Vref2 is obtained as follows from the voltage Vflat.

$$Vref2 = \left(\frac{R_4}{R_2 + R_3 + R_4}\right)(Vbe + R_2 \cdot I_{PTAT}) \quad (3)$$

The first reference voltage Vref1 is a voltage as shown below.

$$Vref1 = V_{flat} + R_1 \cdot Iptat2 \quad (4)$$

$$Vref1 = \left(\frac{R_3 + R_4}{R_2 + R_3 + R_4}\right) \cdot (Vbe + R_2 \cdot Iptat2) + R_1 \cdot Iptat2$$

The resistance value is adjusted in such a manner that the temperature dependence of the base-emitter voltage Vbe of each bipolar transistor and the temperature dependence of the product of the Iptat current and the resistor R2 are cancelled, thereby obtaining the voltage Vflat having no temperature dependence. By dividing the voltage Vflat having no temperature dependence by the resistance ratio of R2, R3, and R4 as shown in the above formula (3), the second reference voltage Vref2 can be set to any voltage value and becomes a reference voltage which has no temperature dependence and is flat with respect to temperature.

As shown in the above formula (4), the first reference voltage Vref1 is represented by adding the voltage value of the product of the resistor R1 and the Iptat 2 current to the voltage Vflat having no temperature dependence. By switching the value of the resistor R1 by the temperature trimming signal T_TRIM, the temperature characteristic can be arbitrarily controlled. As described later, by controlling the temperature characteristic of the first reference voltage Vref1, the temperature characteristic of the resistor R5 used for the current generation circuit shown in FIG. 6 can be cancelled.

Figure 6:
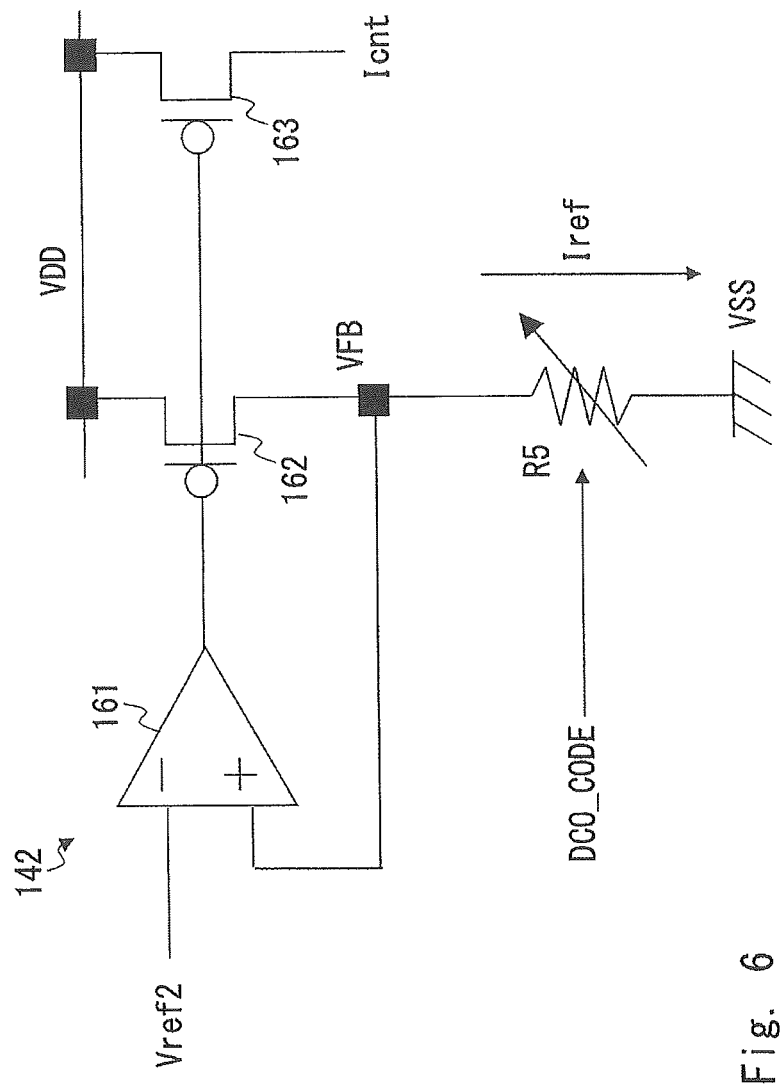
FIG. 6 is a circuit diagram showing a current generation circuit in the digital control oscillator of the FLL circuit according to an embodiment.

FIG. 6 is a circuit diagram showing the current generation circuit 142 according to an embodiment. The current generation circuit according to this embodiment includes a differential amplifier 161, PMOS transistors 162 and 163, and the variable resistor R5. A feedback loop composed of the differential amplifier 161 and the PMOS transistor 162 allows a node Vfb to be set at a voltage value equal to the first reference voltage Vref1. Accordingly, a current Iref obtained by dividing the value of the first reference voltage Vref1 by the value of the resistor R5 is generated as shown in the following formula (5).

$$Iref = \frac{Vref1}{R5} \quad (5)$$

The current Iref is current-mirrored by the PMOS transistor 163, and the reference current Icnt generated by the current mirror is output to the oscillation circuit 143.

In this case, the digital control oscillator 140 according to this embodiment carries out temperature trimming in each of the reference voltage generation circuit 141 and the current generation circuit 142, and generates the current Iref which has no temperature dependence and is flat with respect to temperature.

For example, in the case of carrying out temperature trimming at two points, the current Iref having no primary temperature dependence can be generated. In the case of carrying out temperature trimming at three or more points, not only the primary temperature dependence, but also a secondary temperature dependence can be cancelled. The resistor R5 is preferably composed of a single resistor and uniformly disposed in a local area so as to improve the accuracy of a pair of resistors. The digital control signal DCO_CODE switches the resistance value of the resistor R5, thereby making the frequency to oscillate variable.

The current Iref can be obtained as shown in the following formula (6).

$$Iref = \frac{Vref1}{R5} = \frac{Vref1(1 + Tc1\_v(Temp) + Tc2\_v(Temp)^2)}{R5(1 + Tc1\_r(Temp) + Tc2\_r(Temp)^2)} \quad (6)$$

$$Iref = \frac{Vref1(1 + Tc1\_v(Temp) + Tc2\_v(Temp)^2)(1 - Tc1\_r(Temp) - Tc2\_r(Temp)^2)}{R5}$$

$$Iref = \frac{Vref1(1 - Tc1\_r(Temp) + Tc1\_v(Temp) - Tc1\_v(Temp) \cdot Tc1\_r(Temp))}{R5}$$

In the case of carrying out temperature trimming at two points, the following formula (7) is satisfied and the following formula (8) is obtained.

$$Tc1\_r(Temp) = Tc1\_v(Temp) \quad (7)$$

$$Iref = \frac{Vref1(1 - Tc1\_v(Temp) \cdot Tc1\_r(Temp))}{R5} \quad (8)$$

In this case, the following formula (9) holds.

$$Tc1\_v(\text{Temp}) \cdot Tc1\_r(\text{Temp}) \ll 1 \quad (9)$$

Accordingly, the current Iref can be approximated as shown in the following formula (10).

$$Iref \approx \frac{Vref1}{R5} \quad (10)$$

That is, the temperature dependence of the current Iref is substantially zero. In this case, however, assume that the secondary temperature characteristic of the resistor R5 which does not cause any problem with the required frequency precision is selected.

As shown in the following formula (10), the reference current Icnt is a current obtained by multiplying the current Iref by "m" by current mirror.

$$Icnt = m \cdot Iref \quad (11)$$

Figure 7:
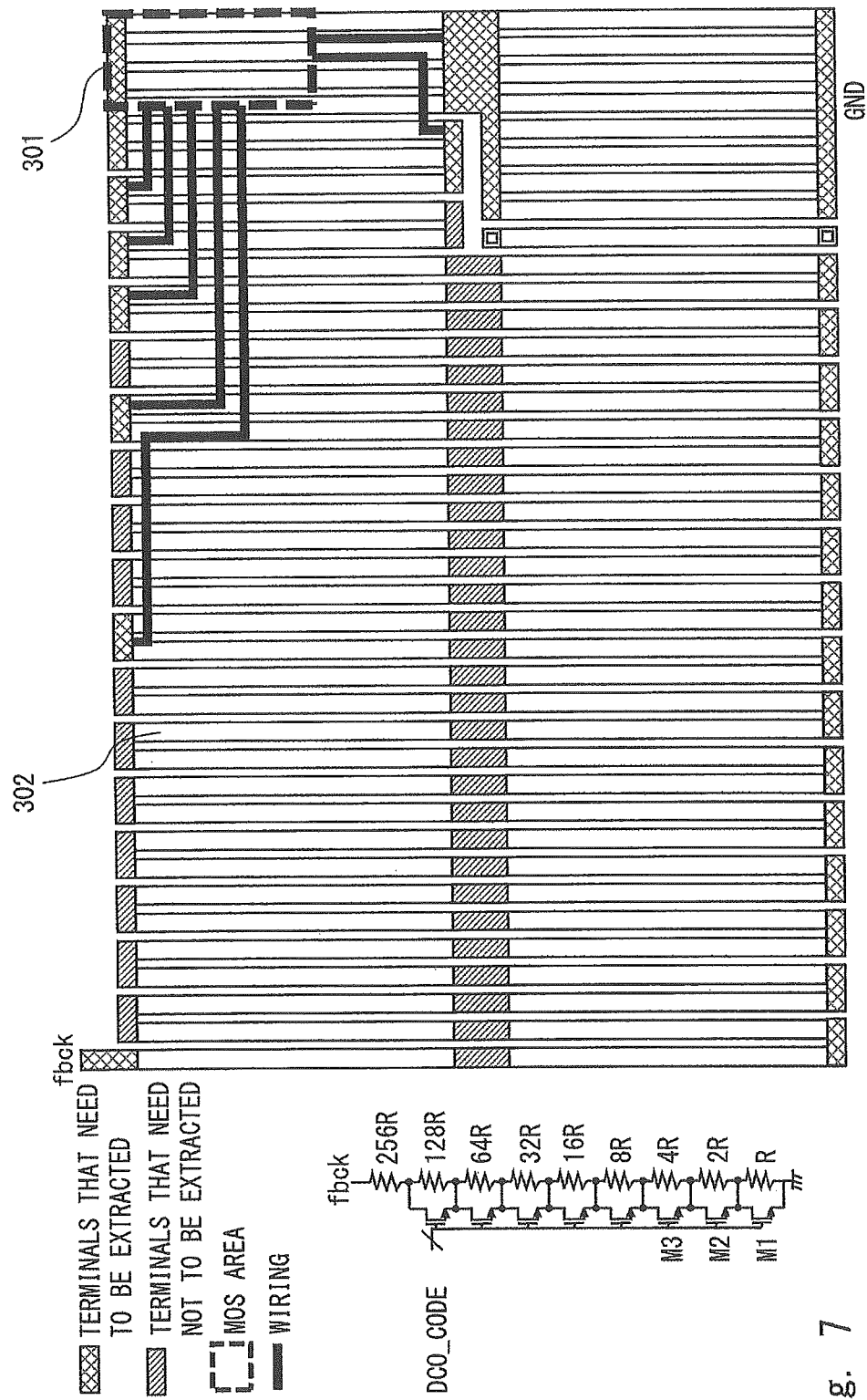
FIG. 7 is a diagram showing a resistor R5 which constitutes a current generation circuit in the digital control oscillator of the FLL circuit according to an embodiment, and also showing a trimming switch which is controlled by a digital control signal DCO_CODE.

FIG. 7 is a diagram showing the resistor R5, which constitutes the current generation circuit 142 of the digital control oscillator 140 according to this embodiment, and also showing a trimming switch controlled by the digital control signal DCO_CODE. As shown in FIG. 7, the variable resistor R5 is composed of a circuit including resistors and NMOS transistors M1, M2, M3, . . . which are connected in parallel. The resistor R5 has a configuration in which resistors respectively having values (R, 2R, 4R, 8R, . . . ), each of which is obtained by weighting a single resistance value R with "2", are connected in series. The resistor is bypassed by turning on an NMOS switch, thereby making the resistance value and the value of the current Iref variable. In this case, the resistor (MOS area) is disposed in the layout pattern shown in FIG. 7, and terminals that are required to be pulled out are gathered together in one place, if possible, thereby forming a switch 301.

Figure 8:
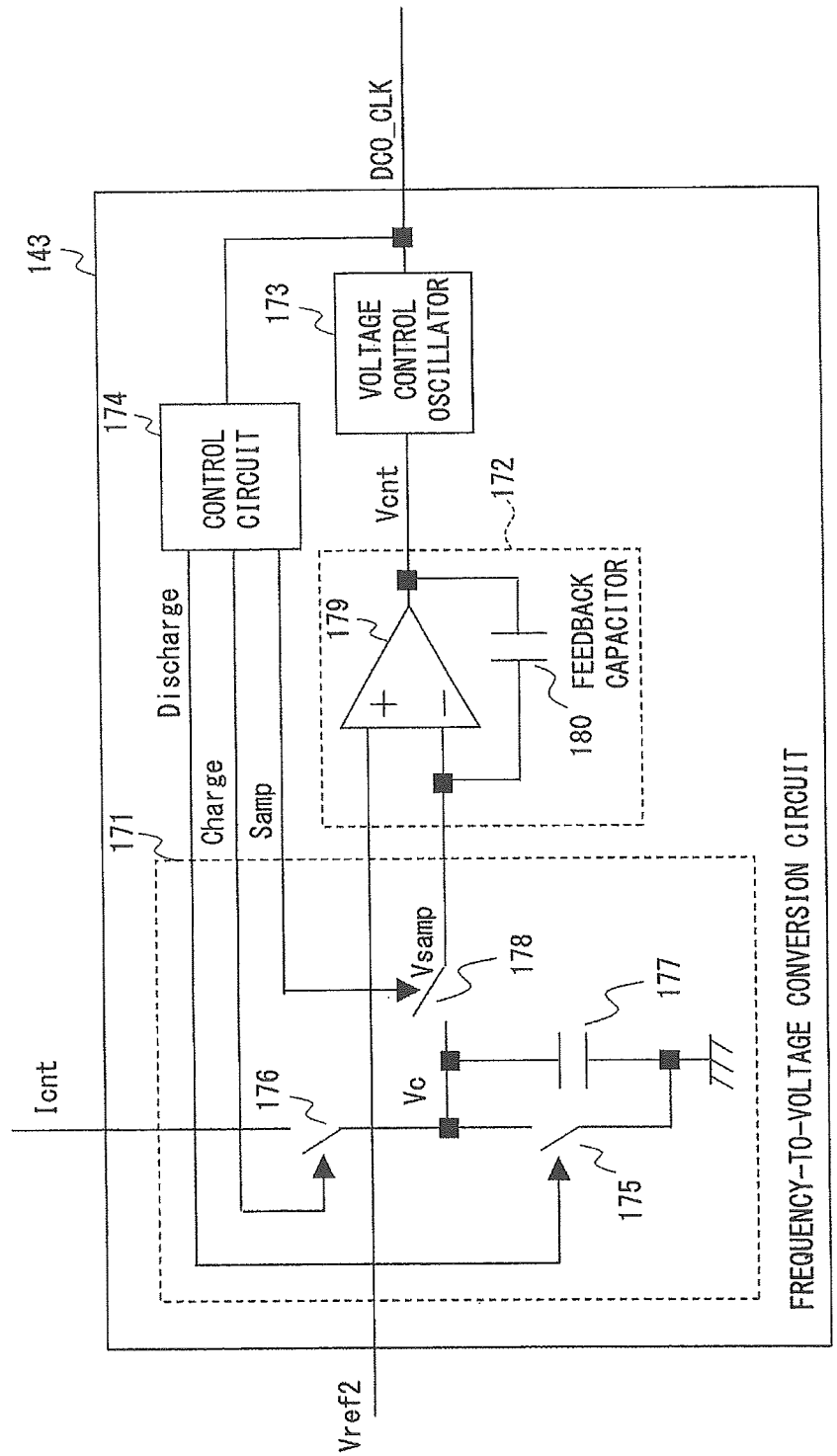
FIG. 8 is a circuit diagram showing an oscillation circuit in the digital control oscillator of the FLL circuit according to an embodiment.

FIG. 8 is a circuit diagram showing the oscillation circuit 143 of the digital control oscillator 140 according to this embodiment. The oscillation circuit 143 includes a frequency-to-voltage conversion circuit 171, an integrating circuit 172, a voltage control oscillator 173, and a control circuit 174.

The frequency-to-voltage conversion circuit 171 includes discharge switches 175 and 176, a capacitor 177, and a switch 178. The discharge switches 175 and 176 are connected in series. The capacitor 177 is connected in parallel with the charge switch 176. The switch 178 is connected to a midpoint between the discharge switch 175 and the charge switch 176 and is also connected to the capacitor 177. The frequency-to-voltage conversion circuit 171 receives the current input Icnt and control signals Charge, Discharge, and Samp as input signals, and outputs a voltage Vsamp. The control signals Discharge and Charge, which are supplied from the control circuit 174, respectively allow the discharge switch 175 and the charge switch 176 to turn on. When the control signal Samp turns on the switch 178, the voltage Vsamp is output to the integrating circuit 172.

The integrating circuit 172 includes an amplifier 179 and a feedback capacitor 180. The integrated circuit 172 receives the voltage Vsamp and outputs a voltage Vcnt. The voltage control oscillator 173 receives the voltage Vcnt and generates the clock DCO_CLK based on the voltage Vcnt. The control circuit 174 receives the clock DCO_CLK, generates the control signals Charge, Discharge, and Samp based on the clock DCO_CLK, and controls the switches 176, 175, and 178 of the frequency-to-voltage conversion circuit 171. The control signal Charge causes the voltage to be accumulated in the capacitor 177, and the control signal Discharge causes the voltage charged in the capacitor 177 to be discharged.

In the oscillation circuit 143, the frequency-to-voltage conversion circuit 171, the integrating circuit 172, the voltage control oscillator 173, and the control circuit 174 form a self-feedback loop. Next, the reason that the oscillation circuit 143 forms the self-feedback loop will be described.

Figure 18:
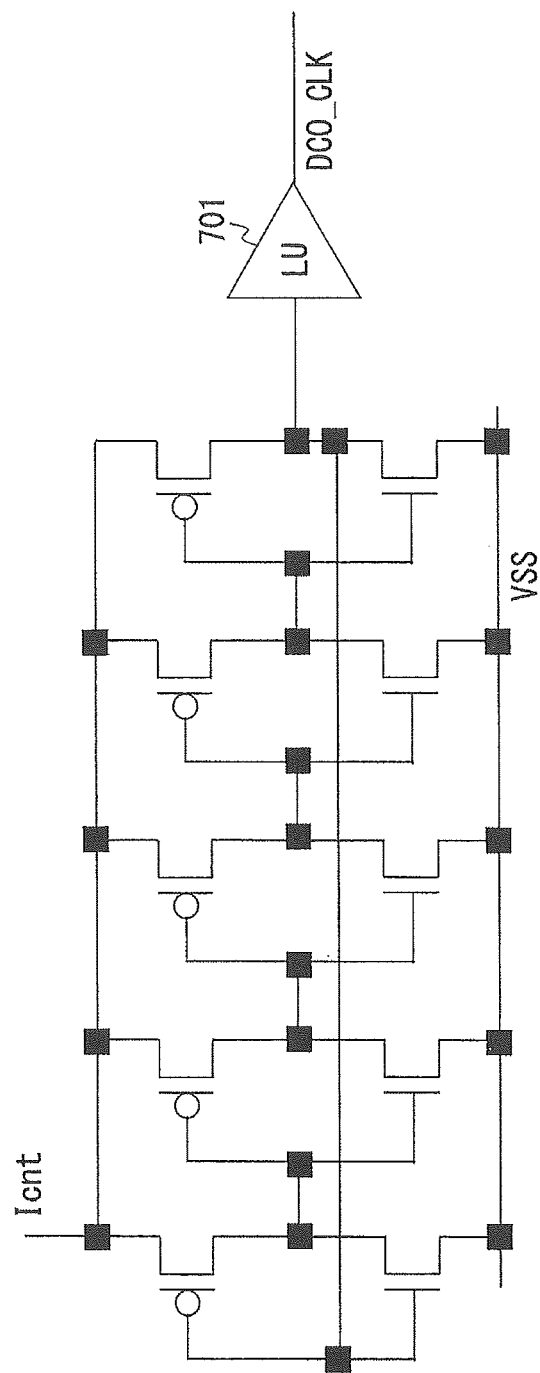
FIG. 18 shows a typical current control oscillator.
Figure 19:
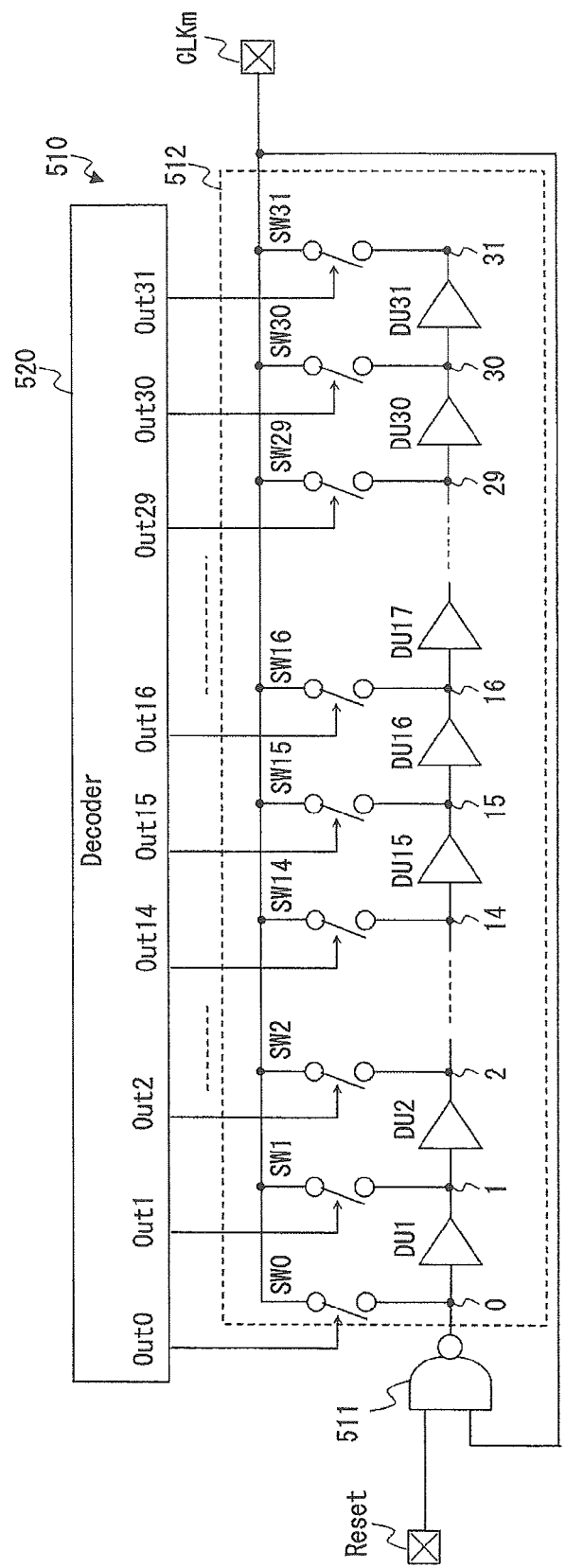
FIG. 19 is a block diagram showing a digital control oscillator of related art.

FIG. 18 shows a typical current control oscillator. The current control oscillator is a circuit having a ring oscillator configuration in which an odd number of stages of inverters each including an NMOS transistor and a PMOS transistor which are connected in series are connected in parallel. The current control oscillator includes a buffer circuit 701 provided at the subsequent stage thereof. The current control oscillator receives the current Icnt and generates a clock. In this case, even when the current Icnt, which is generated as shown in FIGS. 5 and 6, has no temperature dependence, and is flat with respect to temperature, is input to the current control oscillator, an oscillator with a small temperature dependence cannot be formed. This is because, according to the study by the present inventors, the current vs. frequency characteristics of the current control oscillator shown in FIG. 19 show that the current characteristic of each MOS transistor is dominant, and thus have an extremely large temperature dependence.

The above-mentioned temperature trimming is performed on the digital control oscillator 140 shown in FIG. 4, and the frequency of the DCO clock DCO_CLK is measured at two temperatures. Further, the value of the temperature trimming signal T_TRIM is switched so that the frequencies of the DCO clock DCO_CLK measured at two temperatures match each other, thereby making it possible to cancel the primary temperature dependence of the digital control oscillator 140. However, since the frequency characteristic of the DCO clock DCO_CLK generated by the digital control oscillator 140 is determined by the current characteristic of each MOS transistor, the secondary temperature dependence remains.

The oscillation circuit 143 of the digital control oscillator 140 according to this embodiment has a configuration including a self-feedback loop. With this configuration, the digital control oscillator 140 having an extremely small power supply voltage dependence and an extremely small temperature dependence can be achieved. Consequently, a further reduction in lock time can be achieved, and even in the state where no reference clock is provided, a high frequency precision of about +1.5% can be secured.

Figure 9:
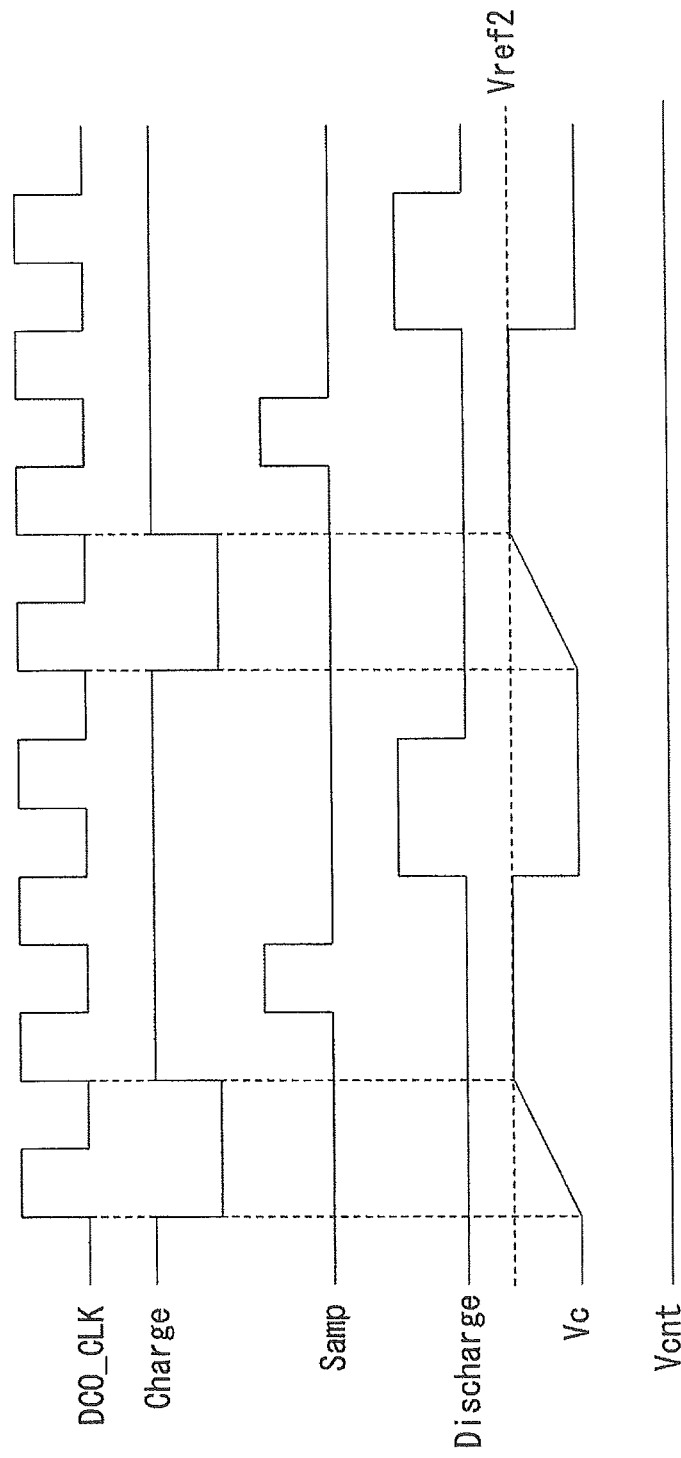
FIG. 9 is a timing diagram showing an operation of the oscillation circuit shown in FIG. 8.
Figure 10:
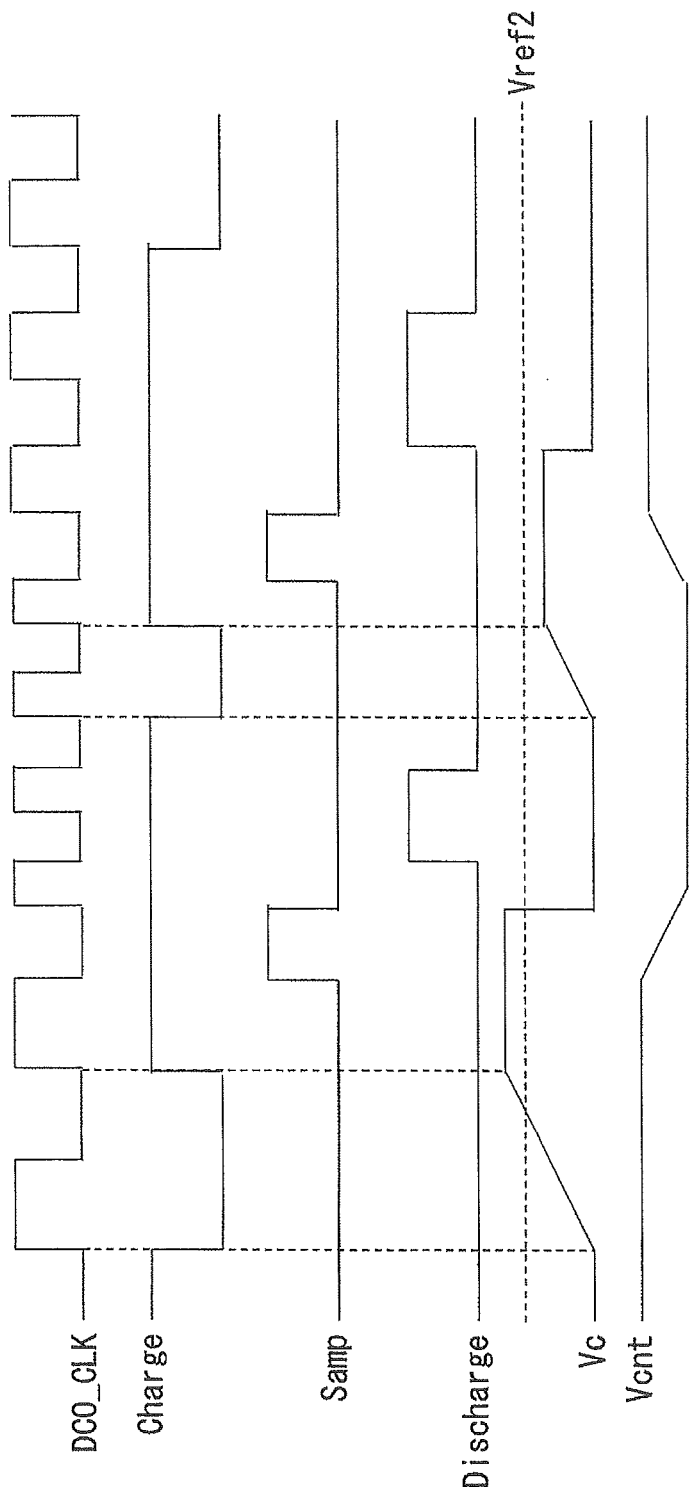
FIG. 10 is a timing diagram showing an operation of the oscillation circuit shown in FIG. 8.

Next, the operation of the oscillation circuit 143 shown in FIG. 8 will be described. FIGS. 9 and 10 are timing diagrams each showing the operation of the oscillation circuit (on-chip oscillator) shown in FIG. 8. As shown in FIG. 9, when the control signal Charge is at a low level, the reference current Icnt generated by the current generation circuit 142 is charged into the capacitor 177 of the frequency-to-voltage conversion circuit 171. The voltage at the node of the capacitor 177 after charging is represented by Vc=Icnt·Tvco/C. The voltage Vc charged in the capacitor 177 is transferred to the integrator 179 of the integrating circuit 172 when the control signal Samp is at a high level. This voltage Vc (Vsamp) is transferred to the integrator 179. After the transferred voltage is held, specifically, after the control signal Samp shifts from the high level to the low level, the control signal Discharge input to the frequency-to-voltage conversion circuit 171 shifts from the low level to the high level at a timing that does not interfere with the frequency-to-voltage conversion operation. Accordingly, the electric charges charged in the capacitor 177 are discharged, resulting in the initial state of 0 V.

After that, the control signal Discharge shifts from the high level to the low level. When the voltage Vc transferred by sampling is higher than the second reference voltage Vref2 as shown in FIG. 10, a control voltage Vcant generated by the integrating circuit 172 decreases. Accordingly, the voltage control oscillator 173 is controlled so that the oscillation frequency becomes higher. On the other hand, when the sampling voltage Vc is lower than the second reference voltage Vref2, the control voltage Vcant generated by the integrating circuit 172 rises. Accordingly, the voltage control oscillator 173 is controlled so that the oscillation frequency becomes lower. As a result of repeating such operations, when the sampling voltage Vc becomes equal to the second reference voltage Vref2 as shown in FIG. 9, the digital control oscillator 140 oscillates stably at a target frequency. The oscillation frequency during the stable oscillation is represented by the following formula (12).

$$Fdco = m \cdot \frac{Vref1}{R5 \cdot C \cdot Vref2} \quad (12)$$

As described above, the temperature characteristics of the first reference voltage Vref1 and the variable resistor R5 are cancelled by temperature trimming. In the reference voltage generation circuit 141, the second reference voltage Vref2 is generated as a voltage that has no temperature dependence and is flat with respect to temperature. Note that in the case of using a monolithic semiconductor device, it is more preferable that a capacitor C be formed of a metal-metal capacitor or a poly(polysilicon)-poly capacitor. Such capacitor devices have an extremely small secondary temperature characteristic. This allows the digital control oscillator 140 to be free of the influence of the temperature dependence of all elements. Accordingly, the digital control oscillator 140 with higher precision can be achieved.

The bandwidth design of the self-feedback loop of the digital control oscillator 140 will now be described. The self-feedback loop needs to be designed so that there is no adverse effect on the feedback operation of the FLL circuit 112. When the feedback loop is considered in the same manner as in Sung Tae Moon, Ari Yakov Valero-L'opez, and Edgar S'anchez-Sinencio "FULLY INTEGRATED FREQUENCY SYNTHESIZERS: A TUTORIAL", International Journal of High Speed Electronics and Systems @ World Scientific Publishing Company, there is no problem if the self-feedback loop is formed with a tenfold loop bandwidth with respect to the feedback operation of the FLL circuit 112, i.e., the reference clock. For example, when the reference clock has a frequency of 32 KHz, the feedback loop is preferably designed with a loop bandwidth of 320 KHz or more. The temperature trimming signal T_TRIM, which is obtained after the temperature trimming optimized under the conditions of the power supply voltage and temperature to be secured by the microcomputer, and the digital control signal DCO_CODE, which is obtained after carrying out the frequency adjustment, are stored in a memory circuit, such as the flash memory 106, as initial information.

As described above, in the digital control oscillator 140 including the oscillation circuit 143 having the configuration described above and the FLL circuit 112 incorporating the digital control oscillator 140, the temperature dependence and the power supply voltage dependence of the digital control oscillator 140 are extremely small. Accordingly, as long as the conditions of the power supply voltage and the operating temperature at the time when the microcomputer shifts from the sleep state to the active state are within a compensation range, the digital control oscillator 140 reads out the initial information stored in the flash memory 106, thereby making it possible to start the oscillation at a frequency which is in the vicinity of the target frequency and has no adverse effect on the microcomputer operation, prior to the start of the comparison with the reference clock.

The lock time of the FLL greatly contributes to the power supply voltage dependence and the operating temperature dependence of the digital control oscillator incorporated in the FLL. This is because the digital control oscillator includes a control circuit and a control code for complementing the amount of fluctuation in the oscillation frequency due to the power supply voltage and the operating temperature, and if the temperature dependence of each of the control code and the control circuit is large, the number of bits for controlling the temperature dependence inevitably increases, which results in an increase in the lock time.

Since the FLL disclosed in Japanese Unexamined Patent Application Publication No. 2009-188699 has a CMOS circuit configuration, the power supply voltage dependence and the temperature dependence thereof are large. Accordingly, the FLL needs to be provided with a number of delay stages for securing the required frequency range, which leads to an increase in the number of stages and the number of bits of the SAR register. The increase in the number of bits of the SAR register causes problems of an increase in the number of cycles required for determining the control bit and an increase in the lock time.

Further, in the digital control oscillator disclosed in Japanese Unexamined Patent Application Publication No. 2009-188699, a significant reduction in the lock time is achieved as compared with the FLL circuit of related art. However, since the operating temperature condition for the power supply voltage after the standby state is released is different from that for the power supply voltage obtained when the operating temperature and the oscillation frequency information stored in the memory circuit are acquired, a control for compensating for the difference is required. This causes a problem that a lock time for a number of control bits corresponding to the compensation of the difference is required. In other words, the FLL circuit disclosed in Japanese Unexamined Patent Application Publication No. 2009-188699 is required to adjust, by an amount corresponding to several bits, the initial information of the memory circuit and the difference between the operating temperature and the power supply voltage at the time when the FLL circuit shifts to the active state, by comparing the reference clock with the DCO clock DCO_CLK.

Furthermore, there is an extremely strong demand for shortening the lock time in microcomputers that are strongly required to reduce current consumption and in microcomputers that repeat the sleep state and the active state so as to further reduce current consumption.

On the other hand, this embodiment employs a digital control oscillator that is subjected to temperature trimming so as to shorten the lock time. The digital control oscillator generates a reference voltage and a control current in such a manner that the temperature dependence of each of the reference voltage and the control current is substantially cancelled by temperature trimming. Further, the oscillation circuit of the digital control oscillator has a function of controlling the frequency of the clock generated by the oscillation circuit according to the value of the frequency of the generated clock, which makes it possible to compensate for a fluctuation of the power supply voltage, or to follow the fluctuation of the power supply voltage. Consequently, the frequency lock within the range of one reference clock cycle can be achieved.

Since the temperature dependence and power supply voltage dependence of the digital control oscillator 140 are extremely small, the FLL circuit 112 according to this embodiment can oscillate immediately at the time when the microcomputer is switched to the active state from the sleep state. In other words, the FLL circuit 112 carries out temperature trimming and allows the oscillator itself to have a self-feedback function to cause the power supply voltage dependence to be substantially equal to the frequency information stored in the memory circuit, thereby achieving the lock time within the range of one reference clock cycle.

In addition, since the self-feedback loop allows the digital control oscillator to operate so as to stably oscillate with respect to the target frequency, the FLL circuit 112 can oscillate with a precision that allows the microcomputer to operate even in the state where the reference clock is interrupted, or is not supplied.

Next, the FLL controller according to this embodiment will be described. As described above, in the FLL circuit of the related art, the temperature dependence and power supply voltage dependence of the digital control oscillator are large. For this reason, the frequency comparator performs a comparison as to whether the frequency of the DCO clock DCO_CLK is high or low for each reference, and the delay code controller generates the digital control signal DCO_CODE. This results in a problem that deterministic jitter occurs in the DCO clock DCO_CLK. Therefore, in this embodiment, the frequency comparison unit 121 of the FLL controller 120 compares frequencies using two thresholds, thereby making it possible to suppress the occurrence of deterministic jitter.

Figure 11:
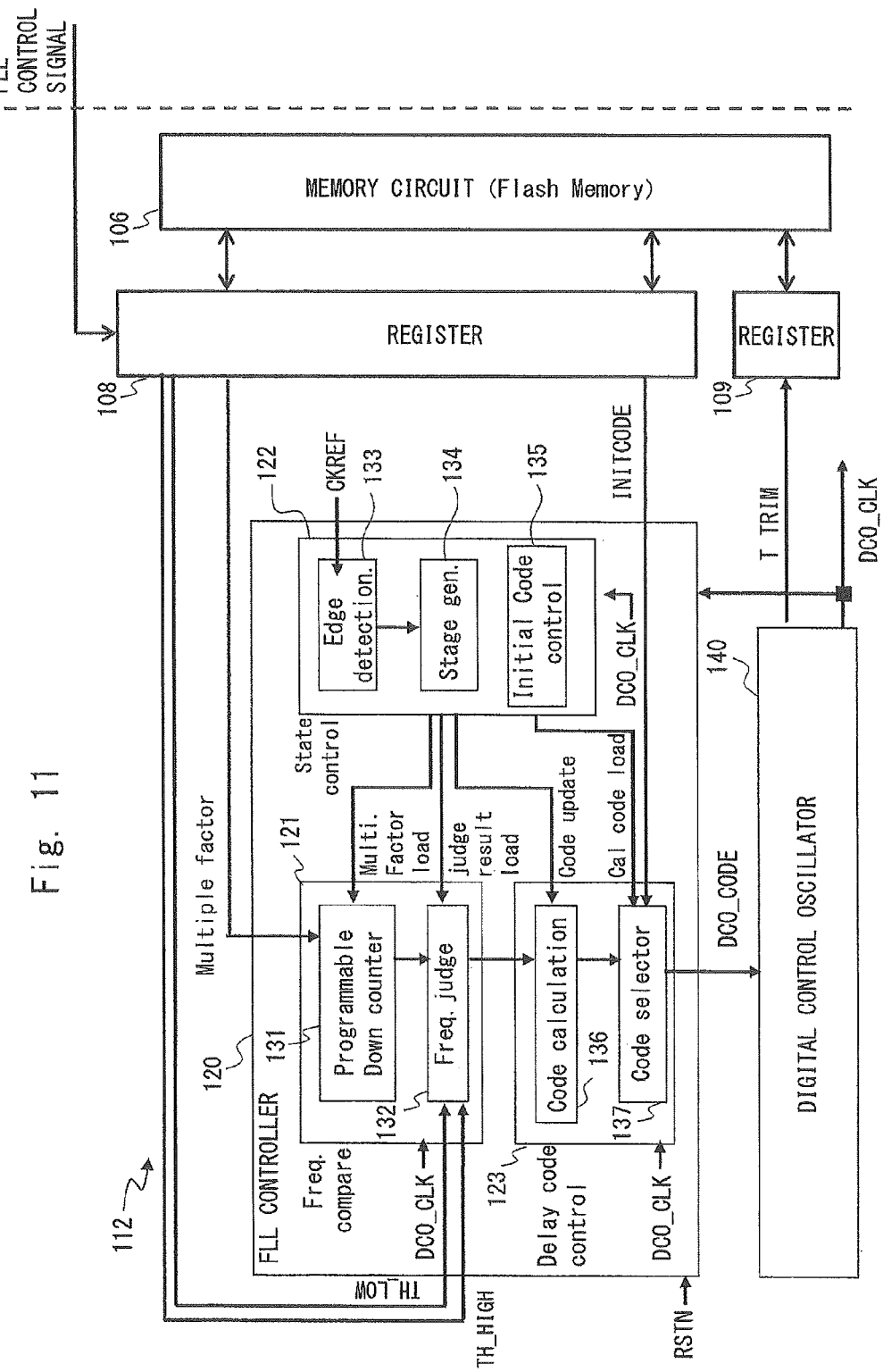
FIG. 11 is a block diagram showing details of the FLL circuit according to an embodiment.
Figure 12:
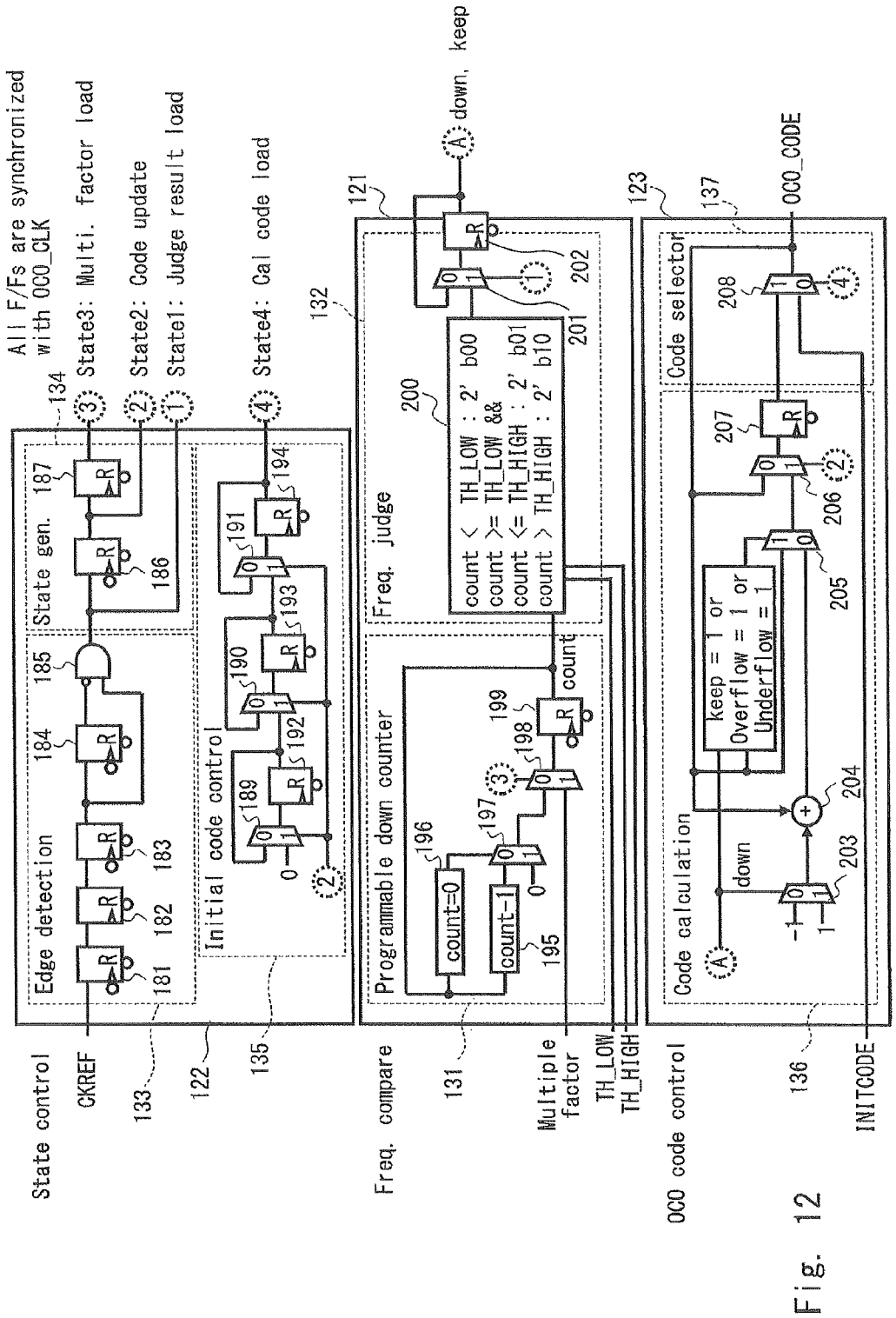
FIG. 12 is a block diagram showing further details of the FLL controller of the FLL circuit according to an embodiment.

FIG. 11 is a block diagram showing details of the FLL circuit according to this embodiment. FIG. 12 is a block diagram showing further details of the FLL controller of the FLL circuit according to this embodiment. As shown in FIG. 11, the FLL controller 120 of the FLL circuit 112 according to this embodiment receives the second threshold TH_HIGH and the first threshold TH_LOW from an external register 108 or the like, and outputs the first and second thresholds to the frequency comparison unit 121.

The frequency comparison unit 121 compares the frequency of the DCO clock DCO_CLK generated by the digital control oscillator 140 with the frequency of the reference clock, and classifies the comparison results of the frequencies into three states according to the second threshold TH_HIGH and the first threshold TH_LOW. The delay code controller 123 generates the digital control signal DCO_CODE according to the three states, and outputs the generated digital control signal to the digital control oscillator 140, thereby controlling the frequency of the DCO clock DCO_CLK.

As shown in FIG. 12, the state controller 122 of the FLL controller 120 includes an edge detection unit 133, a stage generation unit 134, and an initial code control unit 135. The edge detection unit 133 includes a plurality of registers 181 to 184 and an AND circuit 185. The stage generation unit 134 includes registers 186 and 187. The initial code control unit 135 includes a plurality of registers 192 to 194 and selectors 189 to 191.

The edge detection unit 133 constantly monitors the reference clock CKREF by using the DCO clock DCO_CLK. Upon detecting the rise edge of the reference clock CKREF, the stage generation unit 134 and the initial code control unit 135 output control state signals State1, State2 and State3, and a control state signal State4, respectively, which are output to the frequency comparison unit 121 and the delay code controller 123.

Figure 13:
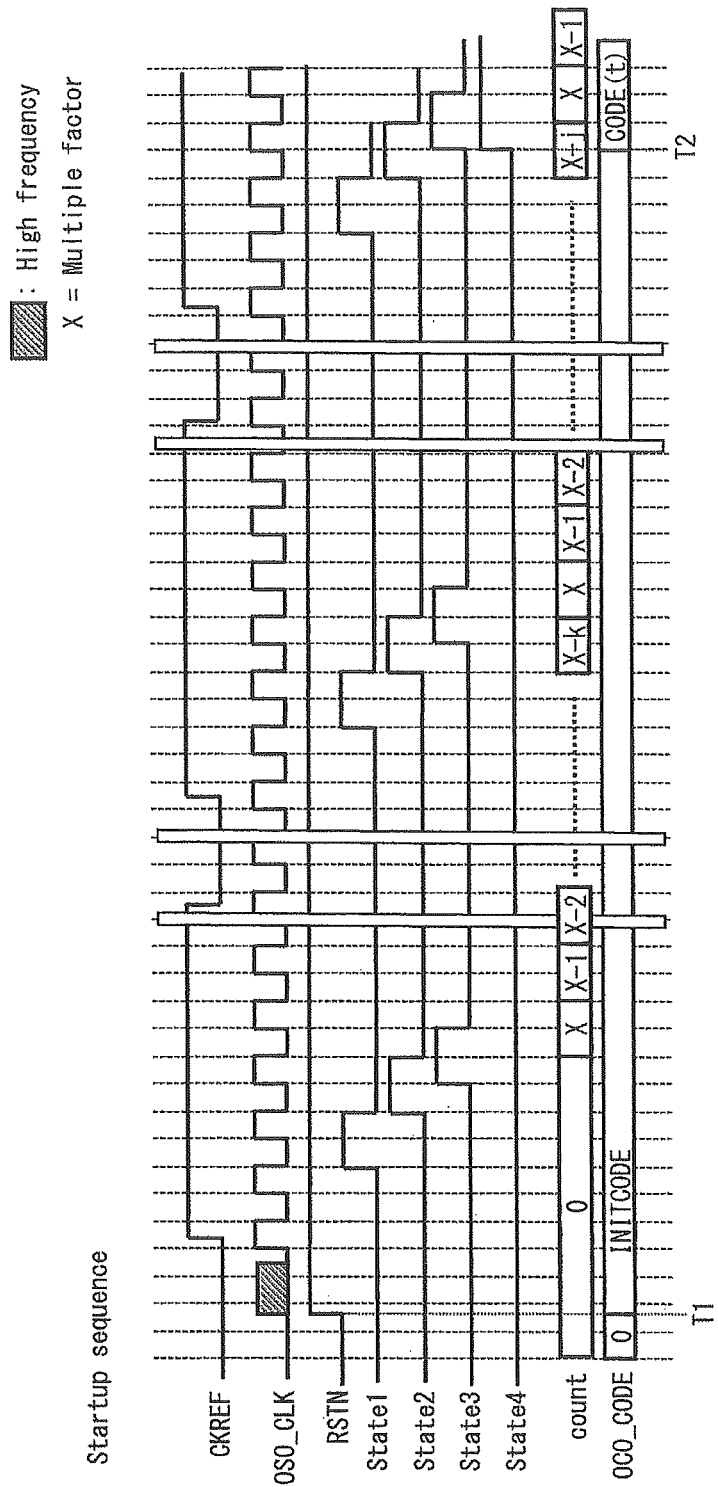
FIG. 13 is a timing diagram showing an operation of the FLL controller shown in FIG. 12.
Figure 14:
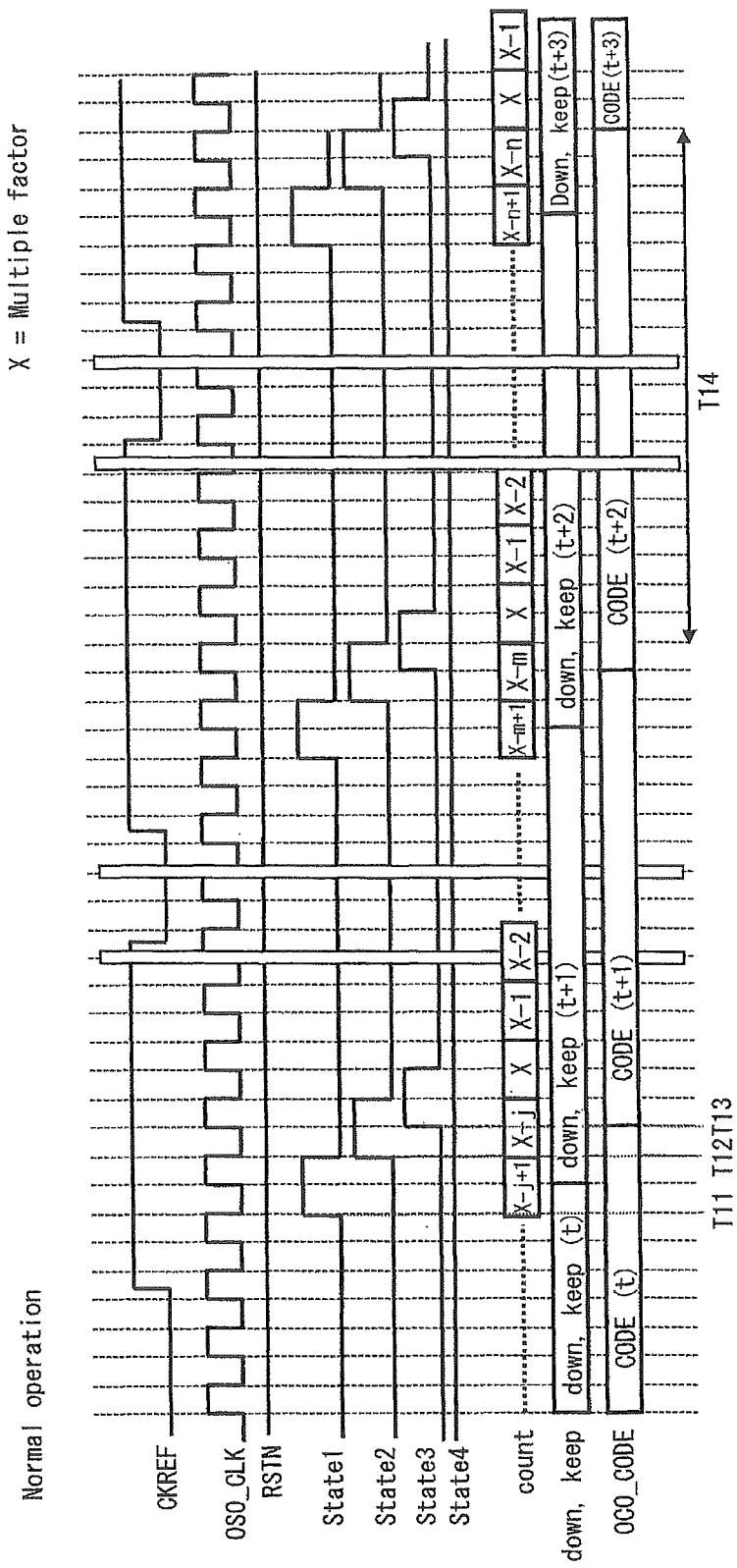
FIG. 14 is a timing diagram showing an operation of the FLL controller shown in FIG. 12.

FIGS. 13 and 14 are timing diagrams each showing the operation of the FLL controller 120 shown in FIG. 12. As shown in FIG. 13, after the rise edge of the reference clock CKREF is detected, pulses of the control state signals State1, State2, and State3, which are output from the stage generation unit 134, are generated in the stated order. When the initial code control unit 135 detects the rise edge of the reference clock CKREF three times after the resetting is released, the control state signal State4 changes from the low level to the high level (timing T2).

A state control in each of the frequency comparison unit 121 and the delay code controller 123 is performed in the following procedure. As shown in FIG. 14, a selector 201 of a frequency determination unit 132 is first switched according to the control state signal State1 (timing T11), and loads the frequency comparison result from a code calculation unit 136 of the delay code controller 123.

Next, a selector 206 of the code calculation unit 136 of the delay code controller 123 is switched according to the control state signal State2 (timing T12), and the digital control signal DCO_CODE, which is calculated based on the comparison result, is updated. A selector 198 of a programmable down counter 131 of the frequency comparison unit 121 is switched according to the control state signal State3 (timing T13), and a multiple factor is loaded. Then, the counter values of counters 196 and 197 of the programmable down counter 131 of the frequency comparison unit 121 are reset.

Further, as shown in FIG. 13, upon detecting the rise edge of the reference clock CKREF three times after the resetting is released at the time of system initialization, the initial code control unit 135 of the state controller 122 switches the control state signal State4 from the low level to the high level (timing T2 in FIG. 13). The delay code controller 123 switches a selector 208 of a code selection unit 137 according to the control state signal State4, and switches the digital control signal DCO_CODE to the calculation result from the initial code INITCODE.

In the frequency comparison unit 121, the programmable down counter 131 counts the number of fall edges of the DCO clock DCO_CLK, and the frequency determination unit 132 determines whether to increase, decrease, or maintain the frequency of the DCO clock DCO_CLK according to the count value.

As shown in the timing diagram of FIG. 14, the counter value of a counter 195 of the programmable down counter 131 is set to a value of a multiple factor after generation of the pulse of the control state signal State3. Then the counter 195 starts down-counting in synchronization with the fall edge of the DCO clock DCO_CLK. When the counter value of the counter 195 reaches zero, the count value of the counter 195 remains zero.

Based on the counter value (count) and two types of frequency determination counter thresholds (first threshold TH_LOW, second threshold TH_HIGH), a determination unit 200 of the frequency determination unit 132 of the frequency comparison unit 121 determines to increase the DCO frequency when the counter value count<the first threshold TH_LOW, determines to hold the DCO frequency when the first threshold TH_LOW≤the count value count≤the second threshold TH_HIGH, and determines to decrease the DCO frequency when the second threshold TH_HIGH<the count value count.

The code calculation unit 136 of the delay code controller 123 shown in FIG. 12 determines whether to increase or decrease the DCO code by "1", or whether to hold the value of the digital control signal DCO_CODE obtained at this time, based on the determination result of the frequency determination unit 132 of the frequency comparison unit 121, calculates a code value after updating, and switches the selector 206 according to the timing of the control state signal State2.

In the code selection unit 137 of the delay code controller 123, the selector 208 selects one of the calculated code value and the DCO initial code (INITCODE) according to the control state signal State4, and outputs the selected code as the digital control signal DCO_CODE.

As shown in the timing diagrams of FIGS. 13 and 14, at the time of initialization, the control is performed in the following manner: during a resetting period until the timing T1, the digital control signal DCO_CODE=0; during a period (timing T1 to timing T2) between a time immediately after the resetting is released and a time when the control state signal State4=Low→High, the digital control signal DCO_CODE=INITCODE; and after a time when the control state signal State 4=Low→High (after timing T2), the digital control signal DCO_CODE=the output of the code calculation unit. In the subsequent normal operation, the digital control signal DCO_CODE is updated every time the rise edge of the reference clock CKREF is detected (period T14).

The frequency comparison unit 121 adjusts the digital control signal DCO_CODE by using two types of frequency determination counter thresholds (first threshold TH_LOW, second threshold TH_HIGH), thereby improving the precision of the output frequency of the DCO clock DCO_CLK. Specifically, a reduction in error of the average frequency, in which the modulation cycle (period T14) of the DCO clock DCO_CLK shown in FIG. 14 is taken into consideration, as well as a reduction in error (jitter) with respect to the target frequency of each DCO clock DCO_CLK cycle can be achieved.

For example, when both of the frequency determination counter thresholds (first threshold TH_LOW, second threshold TH_HIGH) are set to small values so as to reduce the error (jitter) with respect to the target frequency of the DCO clock DCO_CLK, the digital control signal DCO_CODE is adjusted in a direction approaching the target frequency in each frequency determination, so that error (jitter) components are reduced. On the other hand, when the digital control signal DCO_CODE continuously changes by ±1 in the state where the digital control signal DCO_CODE has converged, the error in the average frequency increases, resulting in generation of deterministic jitter.

In this regard, appropriate setting of two types of frequency determination counter thresholds (first threshold TH_LOW, second threshold TH_HIGH) according to the design result of the digital control oscillator 140 makes it possible to add a filter function to the determination of updating of the digital control signal DCO_CODE, to reduce a fluctuation in the digital control signal DCO_CODE and an error in the average frequency, and to reduce deterministic jitter. The effects of the two types of frequency determination counter thresholds (first threshold TH_LOW, second threshold TH_HIGH) vary depending on the multiple factor. Accordingly, it is preferable that the thresholds can be set and controlled by changing register values from the outside of the microcomputer. For example, when the multiple factor is large, that is, when the multiplication factor is large, a counting error occurs due to the characteristic of the long-term jitter of the digital control oscillator 140. Accordingly, it is effective in terms of jitter characteristics to set the range of the frequency determination counter thresholds TH_LOW and TH_HIGH to be wider so as to suppress the fluctuation in the digital control signal DCO_CODE. When the multiple factor is small, that is, when the multiplication factor is small, it is effective in terms of jitter characteristics to set the range of the frequency determination counter thresholds TH_LOW and TH_HIGH to be narrower so that the comparison result is fed back to the digital control oscillator 140.

Figure 15:
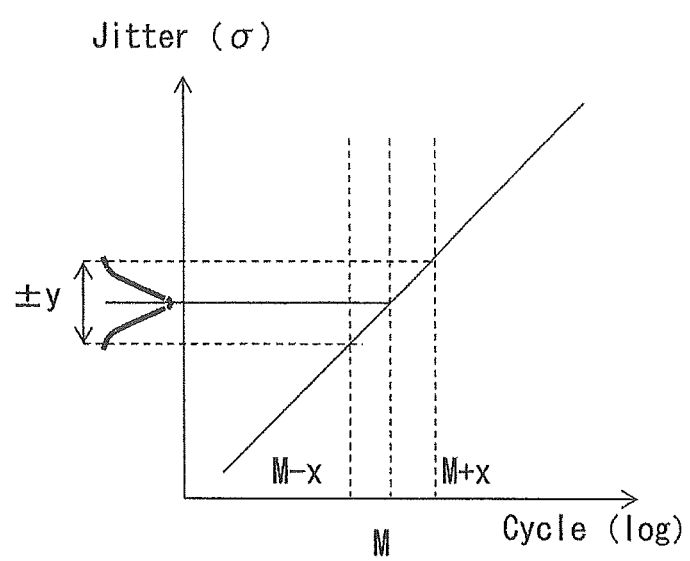
FIG. 15 is a schematic graph showing the relationship between the number of cycles and the magnitude of jitter, where the horizontal axis represents the number of cycles and the vertical axis represents the magnitude of jitter.

Next, a method for setting the frequency determination counter thresholds (first threshold TH_LOW, second threshold TH_HIGH) will be described. FIG. 15 is a schematic graph showing the relationship between the number of cycles and the magnitude of jitter, where the horizontal axis represents the number of cycles (log) and the vertical axis represents the magnitude of jitter. As shown in FIG. 15, the long-term jitter (accumulated jitter) of the FLL circuit 112 that locks only frequencies increases as the number of cycles increases.

The effect of the long-term jitter on the FLL circuit 112 will be described below. FIGS. 16A to 16D are diagrams for explaining the effect of the long-term jitter on the FLL circuit. FIG. 16A is a schematic diagram showing a clock. FIGS. 16B and 16C are schematic diagrams respectively showing short-term jitter and long-term jitter. FIG. 16D is a schematic graph showing the relationship among the long-term jitter, the short-term jitter, and the number of cycles, where the horizontal axis represents the number of cycles and the vertical axis represents the magnitude of jitter. The FLL circuit 112 is capable of performing multiplication with a high multiplication factor of, for example, several hundred to 2048, and can be formed with an area smaller than that of the PLL circuit 111. Accordingly, the frequency comparison unit 121 of the FLL controller 120 needs to count the number of clocks with large accumulated jitter, so it is a challenge to execute a comparison between frequencies with high precision. An error ±X as a result of the comparison between frequencies in an M-th cycle is represented as follows.

$$\pm X = \pm Y/T\text{out}$$

where Y represents long-term jitter in the M-th cycle, and Tout represents an oscillation period.

In this manner, the frequency comparison unit 121 of the FLL controller 120 causes an erroneous determination due to the long-term jitter, and the erroneous determination causes deterioration in the characteristic of short-time jitter (period jitter).

The FLL controller 120 according to an embodiment provides the frequency comparator with binary thresholds (frequency determination counter thresholds TH_LOW and TH_HIGH) as determination criteria so as to prevent an erroneous determination from occurring due to the long-term jitter. When the number of counts of the frequency comparison unit 121 falls within the range from a binary threshold M−x (first threshold TH_LOW) to a binary threshold M+x (second threshold TH_HIGH), the FLL controller 120 determines that the frequencies match, and does not carry out switching of the digital control signal DCO_CODE.

On the other hand, when the frequency of the generated clock exceeds the range from the first binary threshold TH_LOW to the second binary threshold TH_HIGH, the FLL controller 120 determines that the average frequencies do not match, and carries out switching of the digital control signal DCO_CODE.

The long-term jitter increases as the number of cycles increases. Accordingly, it is necessary to increase the magnitude of the binary thresholds as the multiplication factor of the FLL circuit 112 increases. It is necessary to decrease the magnitude of the binary thresholds as the multiple factor decreases. The LSI incorporating the FLL circuit 112 according to this embodiment stores, as information, binary threshold information corresponding to the multiple factor into the memory circuit, and can invoke an optimum value according to the control signal of the FLL circuit 112. The LSI can also determine the thresholds by performing an operation based on design information A.

$$\pm x = \frac{\pm A \times \log(z)}{T\text{out}} \quad (13)$$

where
z: the number of cycles
A: design information
Tout: oscillation period
x: threshold In general, there is a case where the supply of input clocks is stopped due to a trouble in the mounting of a crystal oscillator, for example, an expected trouble such as removal of solder which is caused when a product substrate is repeatedly brought into a high-temperature state and a low-temperature state. In such a case, failing to detect an abnormality and failing to shift to a stop operation lead to runaway of the LSI, which is extremely dangerous when the LSI is used for, for example, a vehicle.

In the FLL controller of the FLL circuit according to this embodiment, the first and second thresholds are used for a comparison between the frequency of the clock generated by the digital control oscillator and the frequency of the multiplied reference clock. This allows the FLL circuit to suppress unnecessary adjustments of the clock frequency, to reduce deterministic jitter, and to reduce the total period jitter. Accordingly, even when the supply of input clocks is stopped due to an unexpected trouble, the abnormality can be detected and the operation can be shifted to the stop operation without causing runaway of the LSI. Furthermore, even in the state where no reference clock is provided (stopped state), a high frequency precision (±1.5%) with which the communication (start-stop communication) between microcomputers can be achieved is secured. In other words, the FLL circuit (frequency-locked loop circuit) according to this embodiment is capable of extracting clocks with high precision, even in the state where the supply of the reference clock is stopped, or no reference clock is input. Therefore, it is also possible to provide a clock source, for which a necessary frequency precision is ensured, to a customer who does not need the RTC circuit.

According to the embodiments described above, it is possible to provide the FLL circuit 112 having a low voltage, low power consumption, and high performance, and the semiconductor integrated circuit incorporating the FLL circuit 112. The semiconductor integrated circuit device according to an embodiment of the present invention can meet the demands of the market, that is, the demand for improvement in battery life of mobile devices, such as a smartphone and a DSC (digital still camera), which operate on a battery, and the demand for improvement in eco-friendly and energy-saving performance of white goods, such as a refrigerator and a washing machine.

The above embodiments can be combined as desirable by one of ordinary skill in the art.

While the invention has been described in terms of several embodiments, those skilled in the art will recognize that the invention can be practiced with various modifications within the spirit and scope of the appended claims and the invention is not limited to the examples described above.

Further, the scope of the claims is not limited by the embodiments described above.

Furthermore, it is noted that, Applicant's intent is to encompass equivalents of all claim elements, even if amended later during prosecution.

What is claimed is:

1. A frequency-locked loop circuit comprising:
a digital control oscillator that generates a clock; and
an FLL (frequency-locked loop) controller that generates a frequency control code to control an oscillation frequency of the clock, wherein
the FLL controller comprises:
a frequency comparison unit that compares a frequency of a clock generated by the digital control oscillator with a frequency of a multiplied reference clock; and
a delay code control unit that generates, based on a comparison result of the frequency comparison unit, the frequency control code so that the frequency of the clock generated by the digital control oscillator matches the frequency of the multiplied reference clock,
the frequency comparison unit determines the frequency of the clock by using first and second thresholds, and
the delay code control unit generates the frequency control code according to a determination result of the frequency comparison unit, and outputs the frequency control code to the digital control oscillator.

2. The frequency-locked loop circuit according to claim 1, wherein the first and second thresholds are set to different values according to a multiplication factor.

3. The frequency-locked loop circuit according to claim 1, wherein the first and second thresholds are set in such a manner that a difference between the first and second thresholds increases as a multiplication factor increases.

4. The frequency-locked loop circuit according to claim 2, wherein when the frequency comparison unit determines that the frequency of the clock is less than the first threshold or greater than the second threshold, the delay code control unit generates the frequency control code to adjust the frequency of the clock, and when the frequency comparison unit determines that the frequency of the clock is equal to or greater than the first threshold and equal to or less than the second threshold, the delay code control unit outputs the frequency control code to maintain the present frequency of the clock.

5. The frequency-locked loop circuit according to claim 1, wherein
the digital control oscillator comprises:
a reference voltage generation circuit that generates first and second reference voltages;
a current generation circuit that receives the first reference voltage and generates a control current; and
an oscillation circuit that receives the second reference voltage and the control current, and generates a clock,
the reference voltage generation circuit and the current generation circuit generate a reference voltage and a control current, respectively, temperature dependence of each of the reference voltage and the control current being substantially cancelled, and
the oscillation circuit has a function of controlling a frequency of a clock generated by the oscillation circuit according to a value of a frequency of the generated clock.

6. The frequency-locked loop circuit according to claim 5, wherein
the reference voltage generation circuit generates the first and second reference voltages by using temperature trimming information generated based on a result of temperature trimming performed by the reference voltage generation circuit and the current generation circuit, and
the current generation circuit generates the control current by using the frequency control code, the control current having substantially no temperature dependence.

7. The frequency-locked loop circuit according to claim 5, wherein
the oscillation circuit comprises:
an integrating circuit that receives the second reference voltage;
a voltage control oscillator that oscillates based on a control voltage output from the integrating circuit; and
a self-feedback loop for the integrating circuit to compare the second reference voltage with a comparison voltage generated based on a frequency of a clock generated by the voltage control oscillator, and
the oscillation circuit controls a value of the control voltage based on the frequency of the clock generated by the voltage control oscillator.

8. The frequency-locked loop circuit according to claim 1, wherein the FLL controller outputs an initial code held in a memory circuit as the frequency control code, during a period between a time immediately after resetting and a time when a normal operation period is started.

9. A semiconductor integrated circuit device comprising:
a frequency-locked loop circuit;
a reference clock supply unit that supplies a reference clock to the frequency-locked loop circuit; and
a memory circuit that holds an initial code used for an initial operation by the frequency-locked loop circuit, wherein
the frequency-locked loop circuit comprises:
a digital control oscillator that generates a clock; and
an FLL (frequency-locked loop) controller that generates a frequency control code to control an oscillation frequency of the clock,
the FLL controller comprises:
a frequency comparison unit that compares a frequency of a clock generated by the digital control oscillator with a frequency of a multiplied reference clock; and
a delay code control unit that generates, based on a comparison result of the frequency comparison unit, the frequency control code so that the frequency of the clock generated by the digital control oscillator matches the frequency of the multiplied reference clock,
the frequency comparison unit determines the frequency of the clock by using first and second thresholds, and
the delay code control unit outputs, to the digital control oscillator, the initial code held in the memory circuit, as the frequency control code, during a period between a time immediately after resetting and a time when a normal operation period is started, and generates and outputs, to the digital control oscillator, the frequency control code according to a determination result of the frequency comparison unit after the normal operation period is started.

10. The semiconductor integrated circuit device according to claim 9, wherein the first and second thresholds are set to different values according to a multiplication factor.

11. The semiconductor integrated circuit device according to claim 9, wherein the first and second thresholds are set in such a manner that a difference between the first and second thresholds increases as a multiplication factor increases.

12. The semiconductor integrated circuit device according to claim 11, wherein when the frequency comparison unit determines that the frequency of the clock is less than the first threshold or greater than the second threshold, the delay code control unit generates the frequency control code to adjust the frequency of the clock, and when the frequency comparison unit determines that the frequency of the clock is equal to or greater than the first threshold and equal to or less than the second threshold, the delay code control unit outputs the frequency control code to maintain the present frequency of the clock.

13. The semiconductor integrated circuit device according to claim 9, wherein
the digital control oscillator comprises:
a reference voltage generation circuit that generates first and second reference voltages;
a current generation circuit that receives the first reference voltage and generates a control current; and
an oscillation circuit that receives the second reference voltage and the control current, and generates a clock, wherein
the reference voltage generation circuit and the current generation circuit generate a reference voltage and a control current, respectively, temperature dependence of each of the reference voltage and the control current being substantially cancelled, and
the oscillation circuit has a function of controlling a frequency of a clock generated by the oscillation circuit according to a value of a frequency of the generated clock.

14. The semiconductor integrated circuit device according to claim 13, wherein
the reference voltage generation circuit generates the first and second reference voltages by using temperature trimming information generated based on a result of temperature trimming performed by the reference voltage generation circuit and the current generation circuit, and the current generation circuit generates the control current the control current by using the frequency control code, the control current having substantially no temperature dependence.

15. The semiconductor integrated circuit device according to claim 13, wherein the oscillation circuit comprises:

an integrating circuit that receives the second reference voltage;

a voltage control oscillator that oscillates based on a control voltage output from the integrating circuit; and a self-feedback loop for the integrating circuit to compare the second reference voltage with a comparison voltage generated based on a frequency of a clock generated by the voltage control oscillator, and the oscillation circuit controls a value of the control voltage based on the frequency of the clock generated by the voltage control oscillator.

16. The frequency-locked loop circuit according to claim 1, wherein the digital control oscillator comprises:

a reference voltage generation circuit that generates first and second reference voltages;

a current generation circuit that receives the first reference voltage and generates a control current; and an oscillation circuit that receives the second reference voltage and the control current, and generates a clock.

17. The frequency-locked loop circuit according to claim 16, wherein the reference voltage generation circuit and the current generation circuit generate a reference voltage and a control current, respectively, temperature dependence of each of the reference voltage and the control current being substantially cancelled.

18. The frequency-locked loop circuit according to claim 16, wherein the oscillation circuit has a function of controlling a frequency of a clock generated by the oscillation circuit according to a value of a frequency of the generated clock.

19. The semiconductor integrated circuit device according to claim 9, wherein the digital control oscillator comprises:

a reference voltage generation circuit that generates first and second reference voltages;

a current generation circuit that receives the first reference voltage and generates a control current; and an oscillation circuit that receives the second reference voltage and the control current, and generates a clock.

20. The semiconductor integrated circuit device according to claim 19, wherein the reference voltage generation circuit and the current generation circuit generate a reference voltage and a control current, respectively, temperature dependence of each of the reference voltage and the control current being substantially cancelled.

* * * * *